(12) United States Patent
Qiu

(10) Patent No.: US 12,707,874 B2
(45) Date of Patent: Aug. 11, 2026

(54) DISPLAY PANEL AND DISPLAY APPARATUS

(71) Applicant: Wuhan Tianma Micro-Electronics Co., Ltd., Wuhan (CN)

(72) Inventor: Xiaobin Qiu, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 412 days.

(21) Appl. No.: 18/214,136

(22) Filed: Jun. 26, 2023

(65) Prior Publication Data

US 2024/0334799 A1 Oct. 3, 2024

(30) Foreign Application Priority Data

Mar. 30, 2023 (CN) ......................... 202310334942.2

(51) Int. Cl.
*H10K 59/65* (2023.01)
*H10K 59/88* (2023.01)

(52) U.S. Cl.
CPC .................................... *H10K 59/88* (2023.02)

(58) Field of Classification Search
None
See application file for complete search history.

(56) References Cited

U.S. PATENT DOCUMENTS

2013/0049003 A1* 2/2013 Choi .................. H10K 59/8722
257/E27.119
2015/0014647 A1* 1/2015 Cho ..................... H10K 59/871
257/40
2016/0111677 A1* 4/2016 Hong ................. H10K 59/8722
257/40
2020/0136087 A1* 4/2020 Kim ................... H10K 59/8731
2021/0066418 A1* 3/2021 Seo ......................... H10K 59/88
2024/0224716 A1* 7/2024 Du ..................... H10K 59/8731

FOREIGN PATENT DOCUMENTS

CN 113270462 A 8/2021

* cited by examiner

*Primary Examiner* — Sarah K Salerno
(74) *Attorney, Agent, or Firm* — Anova Law Group, PLLC

(57) ABSTRACT

A display panel and a display apparatus are provided in the present disclosure. The display panel includes a substrate; a drive circuit layer, at least including a first metal layer and a second metal layer; a light-emitting functional layer; and a first electrode layer. A plurality of first isolation structures is on a side of the substrate and in a non-display region; and at least one first isolation structure isolates at least one of the light-emitting functional layer, the first electrode layer, and other corresponding film layers extending to the non-display region. At least one first isolation structure includes a first portion and a second portion configured to be stacked with each other; the first portion is at the first metal layer; the second portion is at the second metal layer; and the first metal layer and the second metal layer are separated by an insulating layer.

20 Claims, 24 Drawing Sheets

DISPLAY PANEL AND DISPLAY APPARATUS

CROSS-REFERENCE TO RELATED APPLICATION

The present disclosure claims the priority of Chinese Patent Application No. 202310334942.2, filed on Mar. 30, 2023, the content of which is incorporated herein by reference in its entirety.

TECHNICAL FIELD

The present disclosure generally relates to the field of display technology and, more particularly, relates to a display panel and a display apparatus.

BACKGROUND

OLED (organic light-emitting diode) display devices are widely used in various fields due to their light weight, wide viewing angle, fast response, low temperature resistance, high luminous efficiency, and the ability to prepare curved flexible displays.

A conventional OLED display includes a display panel and a thin-film encapsulation structure around the display panel. The display panel includes an array substrate and an organic light-emitting material layer evaporated on the array substrate. The thin-film encapsulation structure is configured to isolate water vapor and oxygen from the outside of the device to improve the lifetime of the display. During the formation process of the display screen, the display screen needs to be cut to form a display screen with a suitable size. However, the thin-film encapsulation structure on the display screen cannot completely cover the evaporated organic light-emitting material layer, and water vapor and oxygen are easy to invade after cutting, which may result in encapsulation failure. The organic light-emitting material layer is very sensitive to water vapor and oxygen. Therefore, once water vapor and oxygen invade to form a transmission channel, it is easy to cause light-emitting failure in display regions, which may affect the display quality.

Therefore, there is a need to provide a display panel and a display apparatus that can effectively block the transmission path of water vapor and oxygen to the display regions through the organic light-emitting material layer and ensure the display quality.

SUMMARY

One aspect of the present disclosure provides a display panel including a display region and a non-display region adjacent to the display region. The display panel includes a substrate; a drive circuit layer, at least including a first metal layer and a second metal layer, where the second metal layer is on a side of the first metal layer away from the substrate; a light-emitting functional layer, on a side of the drive circuit layer away from the substrate, where the light-emitting functional layer includes a plurality of light-emitting portions; and a first electrode layer, on a side of the light-emitting functional layer away from the substrate. A plurality of first isolation structures is on a side of the substrate and in the non-display region; and at least one first isolation structure isolates at least one of the light-emitting functional layer, the first electrode layer, and other corresponding film layers extending to the non-display region. Along a direction perpendicular to a plane of the display panel, the at least one first isolation structure includes a first portion and a second portion which are configured to be stacked with each other; the first portion is at the first metal layer; the second portion is at the second metal layer; and the first metal layer and the second metal layer are separated by an insulating layer.

Another aspect of the present disclosure provides a display apparatus. The display apparatus includes a display panel, including a display region and a non-display region adjacent to the display region. The display panel includes a substrate; a drive circuit layer, at least including a first metal layer and a second metal layer, where the second metal layer is on a side of the first metal layer away from the substrate; a light-emitting functional layer, on a side of the drive circuit layer away from the substrate, where the light-emitting functional layer includes a plurality of light-emitting portions; and a first electrode layer, on a side of the light-emitting functional layer away from the substrate. A plurality of first isolation structures is on a side of the substrate and in the non-display region; and at least one first isolation structure isolates at least one of the light-emitting functional layer, the first electrode layer, and other corresponding film layers extending to the non-display region. Along a direction perpendicular to a plane of the display panel, the at least one first isolation structure includes a first portion and a second portion which are configured to be stacked with each other; the first portion is at the first metal layer; the second portion is at the second metal layer; and the first metal layer and the second metal layer are separated by an insulating layer.

Other aspects of the present disclosure may be understood by those skilled in the art in light of the description, the claims, and the drawings of the present disclosure.

BRIEF DESCRIPTION OF THE DRAWINGS

The accompanying drawings, which are incorporated into a part of the specification, illustrate embodiments of the present disclosure and together with the description to explain the principles of the present disclosure.

DETAILED DESCRIPTION

Figure 1:
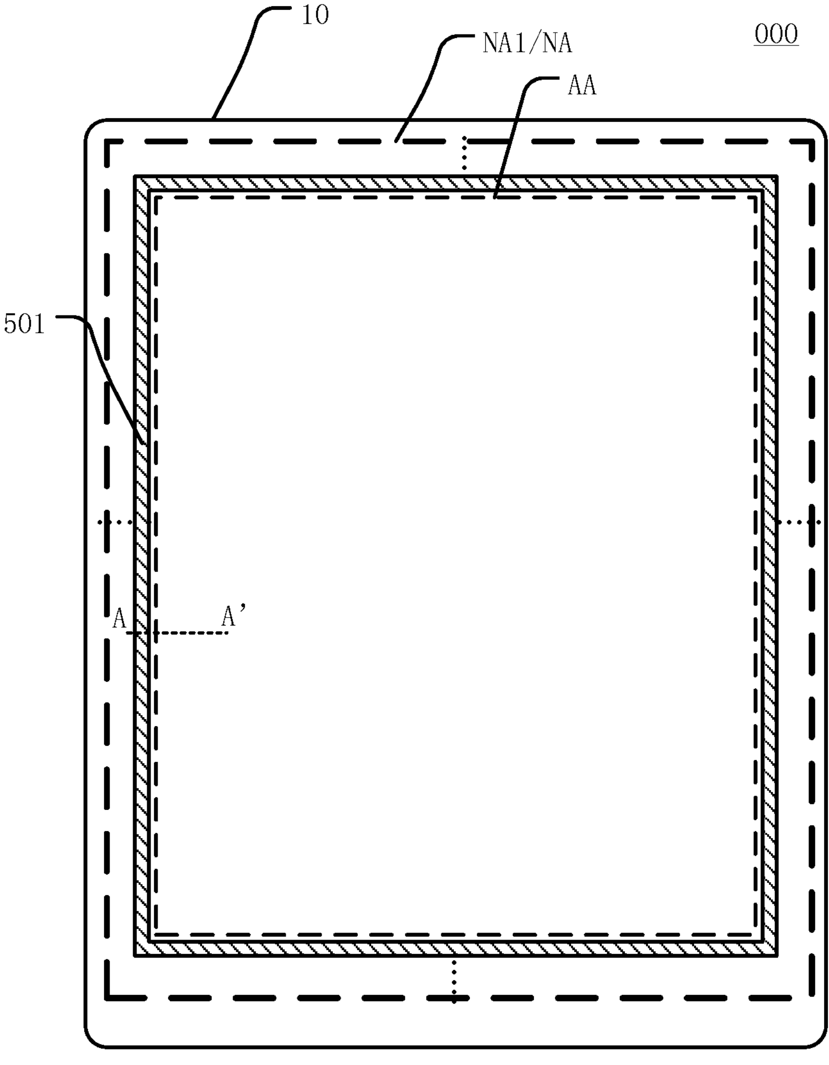
FIG. 1 illustrates a planar structural schematic of a display panel according to various embodiments of the present disclosure.

Various exemplary embodiments of the present disclosure are described in detail with reference to accompanying drawings. It should be noted that unless specifically stated otherwise, relative arrangement of assemblies and steps, numerical expressions and values described in those embodiments may not limit the scope of the present disclosure.

Following description of at least one exemplary embodiment may be merely illustrative and may not be configured to limit the present disclosure and its application or use.

The technologies, methods and apparatuses known to those skilled in the art may not be discussed in detail, but where appropriate, the technologies, methods and apparatuses should be considered as a part of the present disclosure.

In all examples shown and discussed herein, any specific value should be interpreted as merely exemplary, rather than as a limitation. Therefore, other examples in exemplary embodiment may have different values.

It should be noted that similar reference numerals and letters are configured to indicate similar items in following drawings. Therefore, once an item is defined in one drawing, it does not need to be further discussed in subsequent drawings.

Figure 2:
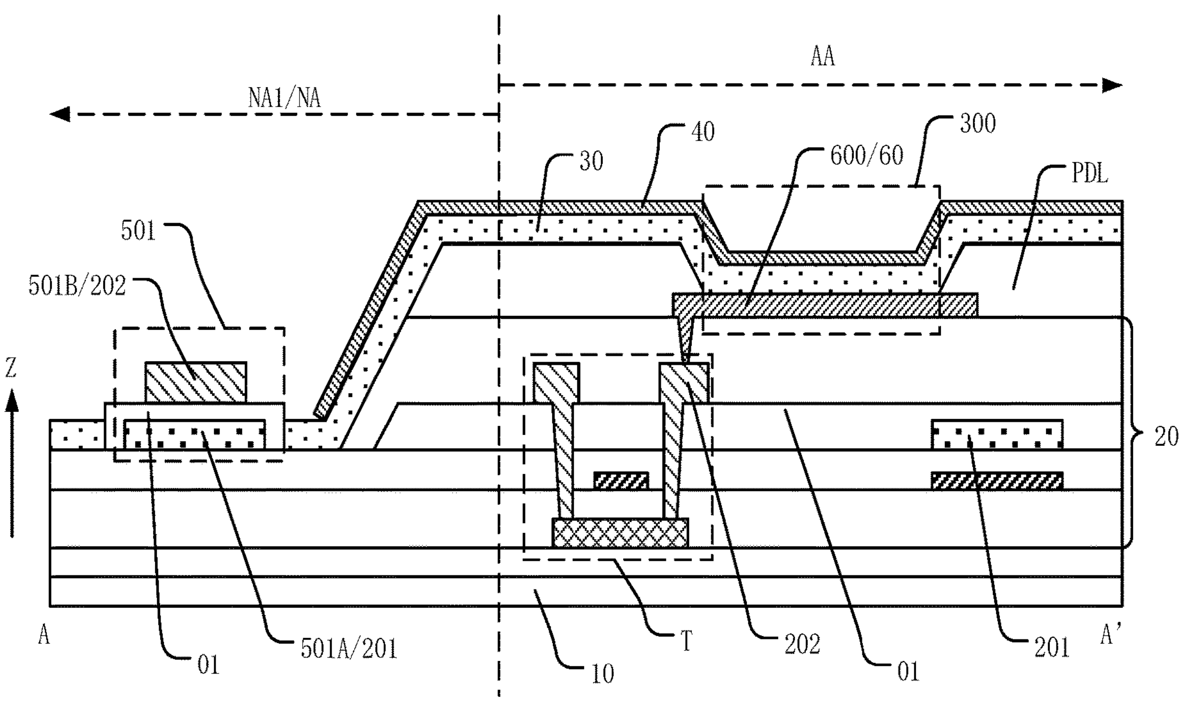
FIG. 2 illustrates a cross-sectional structural view along an A-A' direction in FIG. 1.

Referring to FIGS. 1-2, FIG. 1 illustrates a planar structural schematic of a display panel according to various embodiments of the present disclosure; and FIG. 2 illustrates a cross-sectional structural view along an A-A' direction in FIG. 1. A display panel 000 provided in one embodiment may include a display region AA and a non-display region NA adjacent to the display region AA.

The display panel 000 may include a substrate 10; a drive circuit layer 20 at least including a first metal layer 201 and a second metal layer 202, where the second metal layer 202 may be on the side of the first metal layer 201 away from the substrate 10; a light-emitting functional layer 30 on the side of the drive circuit layer 20 away from the substrate 10, where the light-emitting functional layer 30 may include a plurality of light-emitting portions 300; a first electrode layer 40 on the side of the light-emitting functional layer 30 away from the substrate 10; and a plurality of first isolation structures 501 on the side of the substrate 10. The first isolation structure 501 may be in the non-display region NA; and at least one first isolation structure 501 may isolate at least one of the light-emitting functional layer 30, the first electrode layer 40, and other corresponding film layers extending to the non-display region NA. Along the direction Z perpendicular to the plane of the display panel 000, at least one first isolation structure 501 may include a first portion 501A and a second portion 501B which may be configured to be stacked with each other; the first portion 501A may be at the first metal layer 201; the second portion 502 may be at the second metal layer 202; and the first metal layer 201 and the second metal layer 202 may be separated by an insulating layer 01.

For example, the display panel 000 provided in one embodiment may be an organic light-emitting diode display panel and include the substrate 10 for carrying other film layers of the substrate. In one embodiment, the material of the substrate 10 may not be limited and may be any one of flexible or hard materials, such as polyimide, glass, ceramic materials and the like, which may be configured according to actual need during implementation. The drive circuit layer 20 may be on one side of the substrate 10. The drive circuit layer 20 may include at least the first metal layer 201 and the second metal layer 202; the second metal layer 202 may be farther away from the substrate 10 than the first metal layer 201; and the first metal layer 201 and the second metal layer 202 may be separated by the insulating layer 01. That is, during the formation process, after the first metal layer 201 is formed, the insulating layer 01 may need to be formed, and then the second metal layer 202 may be formed on the insulating layer 01, such that the first metal layer 201 and the second metal layer 202 may be separated by an insulating layer 01. It may be understood that when some structures in the first metal layer 201 and some structures in the second metal layer 202 need to be electrically connected, it may be realized through punching holes in the insulating layer 01, which may not be described in detail in one embodiment. The drive circuit layer 20 may be configured to make drive devices and drive circuits and the like. For example, the drive circuit layer 20 may be used to make the signal wiring for drive the display panel 000 to emit light, the thin-film transistor of the pixel circuit, the capacitance structure and the like, which may not be described in detail in one embodiment and may be understood with reference to the structure of the organic light-emitting diode display panel in the existing technology during actual implementation. It should be noted that the drive circuit layer 20 in one embodiment may at least include the first metal layer 201 and the second metal layer 202. In actual implementation, the number and structure of the metal layers in the drive circuit layer 20 may include, but may not be limited to, above number and structure, and may also include other metal film layers, which may be only exemplary in one embodiment. The side of the drive circuit layer 20 facing away from the substrate 10 may be provided with the light-emitting functional layer 30. The light-emitting functional layer 30 may be made of an organic light-emitting material vapor-deposited on the display panel 000. The light-emitting functional layer 30 may include a plurality of light-emitting portions 300. The light-emitting portions 300 may correspond to sub-pixels. The pixel circuit made by drive the circuit layer 20 may drive the light-emitting portion 300 of the light-emitting functional layer 30 to emit light, and the light-emitting portion 300 of different colors may correspond to sub-pixels of different colors, thereby further realizing the display picture of the display panel 000. The side of the light-emitting functional layer 30 facing away from the substrate 10 may include the first electrode layer 40 which may be a cathode with an entire surface structure. Optionally, an anode layer 60 may be configured between the light-emitting functional layer 30 and the drive circuit layer 20. The anode layer 60 may include a plurality of anodes 600 corresponding to the light-emitting portions 300.

When the display panel 000 of one embodiment is powered on to emit light, at least one thin-film transistor T in the pixel circuit provided on the drive circuit layer 20 may be electrically connected to the anode 600; the picture display signal may be transmitted to the source electrode of the thin-film transistor T under the control of the gate of the thin-film transistor T in the drive circuit layer 20, and transmitted from the source electrode of the thin-film transistor T to the drain electrode of the thin-film transistor; the picture display signal may be transmitted to the anode 600 of the anode layer 60 by the drain electrode of the thin-film transistor T; and the image display signal transmitted to the anode 600 may drive the anode 600 to generate holes. Meanwhile, the signal applied to the first electrode layer 40 may drive the first electrode layer 40 to generate electrons; the holes generated by the anode 600 and the electrons generated by the first electrode layer 40 may be injected into the light-emitting portion 300 of the light-emitting functional layer 30; the electrons and holes may be combined with each other to form excitons; and the light-emitting portion 300 corresponding to the sub-pixel may emit light by the energy generated when the excitons fall from the excited state to the ground state.

Optionally, the light-emitting functional layer 30 may further include one or more layers of a hole injection layer, a hole transport layer, an electron blocking layer, a hole blocking layer, an electron transport layer, and an electron injection layer. The hole injection layer and/or the hole transport layer may be configured between the anode 600 and the light-emitting portion 300; and the electron injection layer and/or the electron transport layer may be configured between the first electrode layer 40 and the light-emitting portion 300, which may not be illustrated in one embodiment and may be understood with reference to the structure of the organic light-emitting diode display panel in the existing technology for details. Furthermore, optionally, the light-emitting portion 300 of the light-emitting functional layer 30 in one embodiment may be a red light-emitting portion, a green light-emitting portion, a blue light-emitting portion, or a single white light-emitting portion, which may not be limited in one embodiment.

It should be noted that, in embodiment of the present disclosure, the light-emitting portion 300 in the display panel 000 may be taken as an example for illustration. In actual implementation, the display panel 000 in one embodiment may also be a bottom emission light-emitting structure, which may not be described in detail herein.

It may be understood that the display panel 000 in one embodiment may also include other film layer structures, such as the encapsulation structure disposed on the side of the first electrode layer 40 away from the substrate 10, and a thin-film encapsulation layer (not shown in drawings). The thin-film encapsulation layer may cover the light-emitting portion 300 to prevent water and oxygen from corroding the light-emitting portion 300. The specific structure of the thin-film encapsulation layer may not be described in detail in one embodiment.

The display panel 000 of one embodiment may include the display region AA and the non-display region NA adjacent to the display region AA. The plurality of light-emitting portions 300 of the light-emitting functional layer 30 may be located in the display region AA. The non-display region NA may be the frame region of the display panel 000. Or in some other optional embodiments, the non-display region NA may also be a non-display region surrounded by the display region AA for placing functional devices such as cameras. In one embodiment, the non-display region NA may be taken as an example to illustrate the frame region of the display panel 000 in drawings. In one embodiment, within the range of the non-display region NA of the display panel 000, the plurality of first isolation structures 501 may be on one side of the substrate 10. At least one first isolation structure 501 may isolate at least one of the light-emitting functional layer 30, the first electrode layer 40, and other corresponding film layers extending to the non-display region NA. Optionally, at least one first isolation structure 501 may be arranged around the display region AA to form a closed structure. It should be noted that the number of first isolation structures 501 in the non-display region NA may not be limited in one embodiment, and the plurality of first isolation structures 501 arranged side by side may be included, which may gradually block the invasion of water and oxygen to the display region AA. When the thin-film encapsulation layer of the display panel 000 cannot completely cover the light-emitting functional layer 30 of the evaporated organic light-emitting material, the plurality of first isolation structures 501 provided in the non-display region NA may isolate at least one of the light-emitting functional layer 30, the first electrode layer 40, or other corresponding film layers extending to the non-display region NA to block the intrusion of water and oxygen after the edge of the panel is cut, thereby being beneficial for avoiding the problem of package failure. The plurality of first isolation structures 501 may prevent water vapor and oxygen from invading the transmission channel of the display region AA and avoid the phenomenon that the light-emitting portion 300 of the display region AA is affected by water and oxygen and fails to emit light, which may be beneficial for ensuring the display quality.

In the existing technology, in order to simplify the formation process, a single-layer metal isolation column structure may be used; and through a side etching process, a shape similar to the side wall recession of the isolation column may be formed, and the organic light-emitting material evaporated at the structure position of the isolation column may be separated. Therefore, water vapor and oxygen may be prevented from intruding into the light-emitting functional layer of the organic light-emitting material structure in the display region. However, in the existing technology, the metal layer used to form the isolation column structure may be not only used to form the signal wiring of the drive circuit in the display panel, but also have the function of isolating the evaporated material through the side etching process; and such two functions may have different requirements for the process technology. That is, the side etching value formed by the side etching process may be affected by normal wiring process requirements such as the signal wiring of the metal layer in the display region, which may result in that the side etching value of the isolation column cannot be adjusted significantly. Furthermore, if the side etching of the isolation column is not sufficient, the isolation effect of the isolation column may be significantly poor, and the passage of water vapor and oxygen intrusion may not be effectively blocked.

In order to solve above problems, in one embodiment, it may configure that, along the direction Z perpendicular to the plane of the display panel 000, at least one first isolation structure 501 may include the first portion 501A and the second portion 501B which are arranged to be stacked with each other; the first portion 501A may be on the first metal layer 201; and the second portion 502 may be on the second metal layer 202. That is, in the one embodiment, among the plurality of first isolation structures 501 provided in the non-display region NA, at least one first isolation structure 501 may include the first portion 501A and the second portion 501B respectively located in two metal layers. The first isolation structure 501 with at least two metal layers stacked with each other may not only make the formation process of the first portion 501A of the first metal layer 201 not be affected by the formation process of the metal wiring of the first metal layer 201 in the display region AA, and also make the formation processes of the second portion 501B and the metal wiring in the display region AA, which are both in the second metal layer 202, to be unaffected by each other. In addition, the height of the first isolation structure 501 may be increased by the first portion 501A and the second portion 501B with two layers stacked with each other. Furthermore, the first portion 501A and the second portion 501B may be separated by a part of the insulating layer 01, which may effectively isolate the evaporated organic light-emitting material when depositing on the first isolation structure 501. Compared with the side-etched isolation column made of single-layer metal in the existing technology, above structure may simplify the formation process of the first portion 501A and the second portion 501B and reduce process difficulty; in addition, the first isolation structure 501 in one embodiment may have a better isolation effect, and the first isolation structure 501 may effectively avoid the phenomenon that the light-emitting portion 300 of the display region AA is affected by water and oxygen and fails to emit light, thereby ensuring the display quality of the display panel 000.

Figure 3:
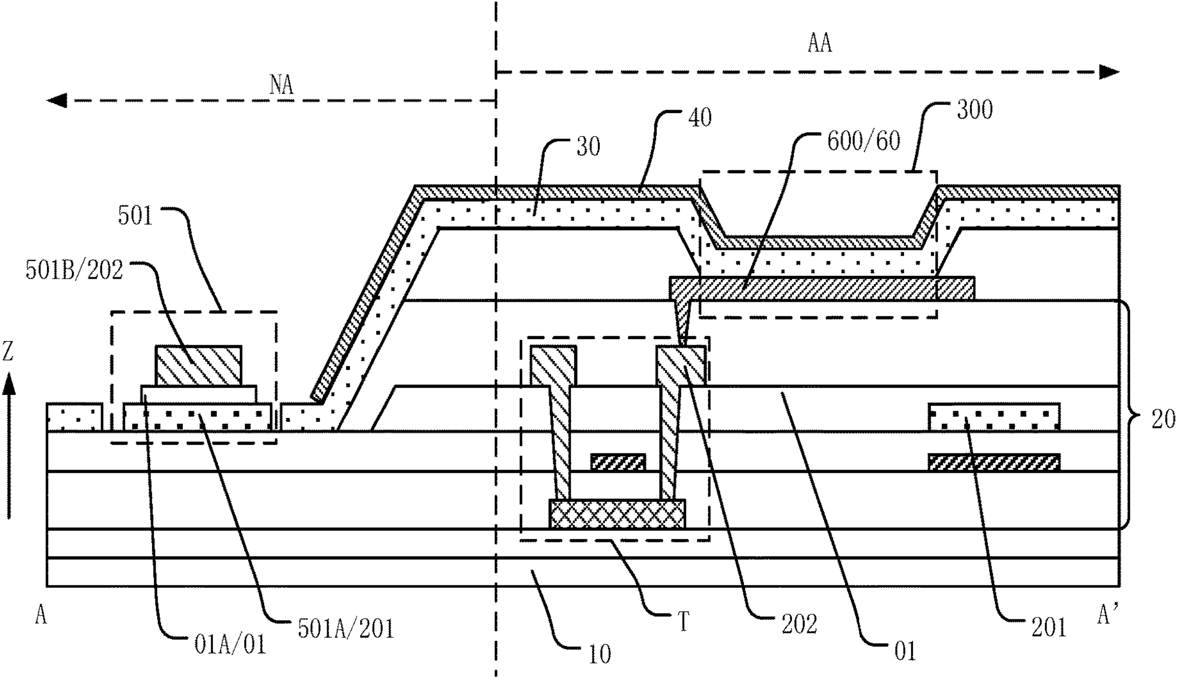
FIG. 3 illustrates another cross-sectional structural view along an A-A' direction in FIG. 1.

Optionally, the area of the second portion 501B of the first isolation structure 501 in one embodiment may be less than the area of the first portion 501A. That is, the orthographic projection of the second portion 501B on the plane of the display panel 000 may be within the range of the orthographic projection of the first portion 501A on the plane of the display panel 000. In such way, the first portion 501A, the second portion 501B, and the part of the insulating layer 01 between the first portion 501A and the second portion 501B may form the first isolation structure 501 with a tapered structure. The insulating layer 01 may be etched at the position of the first isolation structure 501 to form a plurality of independent structures corresponding to the first portion 501A and the second portion 501B, as shown in FIGS. 1 and 3. FIG. 3 illustrates another cross-sectional structural view along the A-A' direction in FIG. 1. After the first portion 501A of the first metal layer 201 and the structure in the first metal layer 201 at the display region AA are formed, the insulating layer 01 may be formed. An independent insulating portion structure 01A corresponding to the independent first portion 501A may be formed through the processes of exposure, development and etching. Next, the second portion 501B of the second metal layer 202 and the structure in the second metal layer 202 at the display region AA may be formed. The first isolation structure 501 may be formed by stacking the first portion 501A, the independent insulating portion structure 01A, and the second portion 501B, which may be equivalent to raising the first isolation structure 501. Without the side etching process, it may realize that when the light-emitting functional layer 30 of the organic light-emitting material climbs on the first isolation structure 501 of the non-display region NA, the first isolation structure 501 of tapered structure may more effectively block the effect of the light-emitting functional layer 30. Furthermore, when the edge of the panel is cut, the first isolation structure 501 of tapered structure may prevent water and oxygen from invading into the light-emitting functional layer 30 of the display region AA, which may be beneficial for further ensuring the display quality.

It may be understood that, in one embodiment, the structure of the display panel 000 in the non-display region NA may include, but may not be limited to, the first isolation structure 501 shown in FIG. 2; and may further include other structures. In one embodiment, only the first isolation structure 501 is clearly shown in FIG. 2, and other structures may be omitted. It should be noted that, in one embodiment, the structure of the display panel 000 may be exemplarily illustrated in drawings. During actual implementation, the structure of the display panel 000 may include, but may not be limited to such configuration, and may further include other structures capable of realizing display functions, which may not be described in detail in one embodiment and may be understood with reference to the structure of the organic light-emitting diode display panel in the existing technology.

Figure 4:
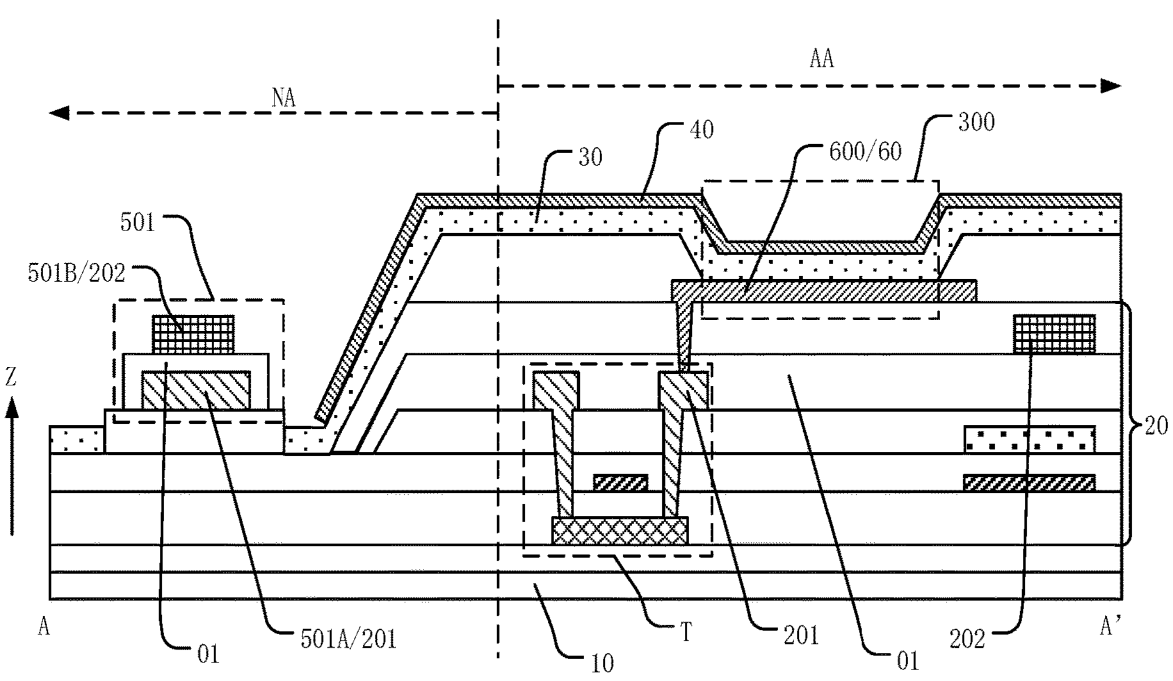
FIG. 4 illustrates another cross-sectional structural view along an A-A' direction in FIG. 1.

Optionally, in one embodiment, referring to FIGS. 1-2, the first portion 501A of the first isolation structure 501 may be on the first metal layer 201; the first metal layer 201 may be a metal layer for forming one electrode of the capacitor in the drive circuit layer 20; the second portion 501B may be on the second metal layer 202; and the second metal layer 202 may be the metal layer used to form the source electrode and the drain electrode of the thin-film transistor T in the drive circuit layer 20, which may only be taken as an example for illustration. In some other optional embodiments, the first metal layer 201 and the second metal layer 202 may also be metal layers in other drive circuit layers 20, as shown in FIG. 4. FIG. 4 illustrates another cross-sectional structural view along the A-A' direction in FIG. 1. The first portion 501A of the first isolation structure 501 may be on the first metal layer 201; the first metal layer 201 may be a metal layer used to form the source electrode and the drain electrode of the thin-film transistor T in the drive circuit layer 20; the second portion 501B may be on the second metal layer 202; and the second portion 501B may be another metal layer above the source electrode and the drain electrode of the thin-film transistor T in the drive circuit layer 20, which may not be described in detail in one embodiment and may be understood with reference to the film layer structure of the drive circuit layer of the organic light-emitting diode display panel in the existing technology. The first isolation structure 501 may also include a structure with more metal layers stacked with each other, which may not be described in detail in one embodiment.

Figure 5:
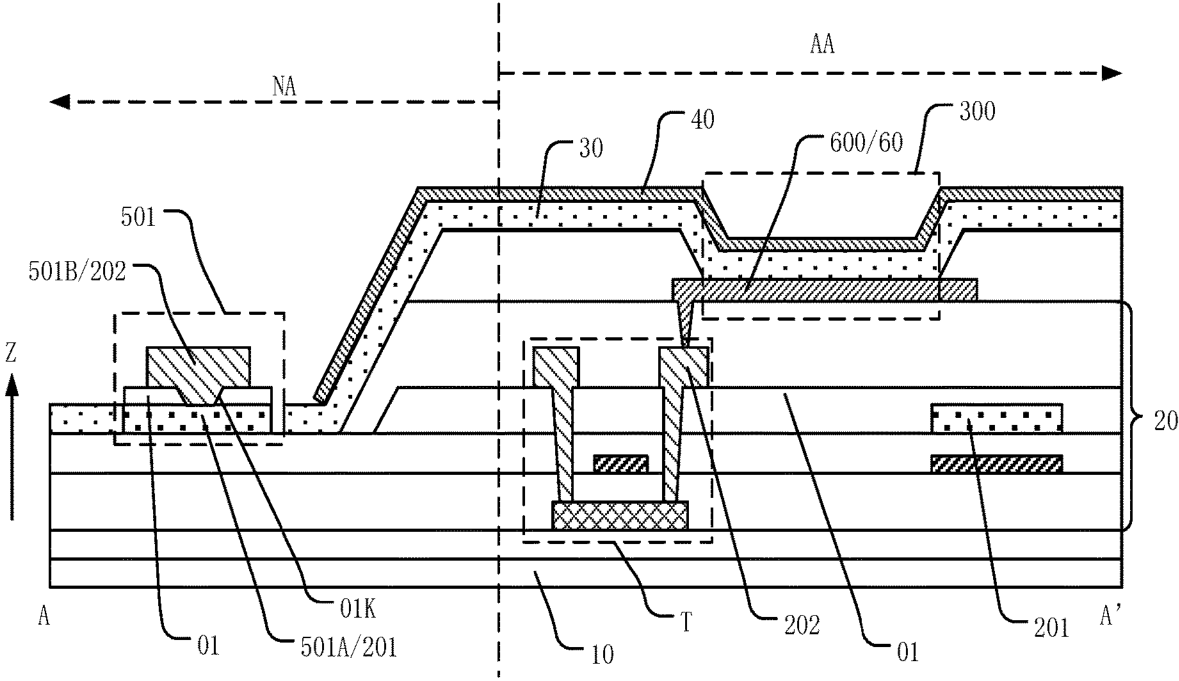
FIG. 5 illustrates another cross-sectional structural view along an A-A' direction in FIG. 1.

In some optional embodiments, referring to FIGS. 1 and 5, FIG. 5 illustrates another cross-sectional structural view along the A-A' direction in FIG. 1. In one embodiment, the insulating layer 01 may include a plurality of hollow portions 01K; the orthographic projection of the hollow portion 01K on the plane of the display panel 000 may be within the range of the orthographic projection of the first portion 501A on the plane of the display panel 000; and at least a part of the second portion 501B may be filled in the hollow portion 01K to be directly contact with the first portion 501A.

In one embodiment, it describes that in the first isolation structure 501 provided in the non-display region NA of the display panel 000, the first portion 501A on the first metal layer 201 and the second portion 501B on the second metal layer 202 may be separated by the insulating layer 01; however, the second portion 501B of the upper layer may be electrically connected to the first portion 501A of the lower layer. For example, the insulating layer 01 between the first metal layer 201 and the second metal layer 202 may be configured with the hollow portion 01K at the position of the first isolation structure 501. The orthographic projection of the hollow portion 01K on the plane of the display panel 000 may be within the range of the orthographic projection of the first portion 501A on the plane of the display panel 000. At least a part of the second portion 501B formed subsequently may be filled in the hollow portion 01K of the insulating layer 01 to realize direct contact and adjoining between the first portion 501A and the second portion 501B. The first portion 501A located in the first metal layer 201 may be connected to a ground signal during the use of the display panel 000, such that the second portion 501B located in the second metal layer 202 may be electrically connected with the first portion 501A of the lower layer, which is equivalent to that the second portion 501B may be also connected to the ground signal. Therefore, the static electricity in each film layer of the display panel 000 or entered static electricity when cutting the edge of the panel may be guided away in time, so that the electrostatic protection effect on the display panel 000 may be realized, thereby being beneficial for ensuring the display quality.

Figure 6:
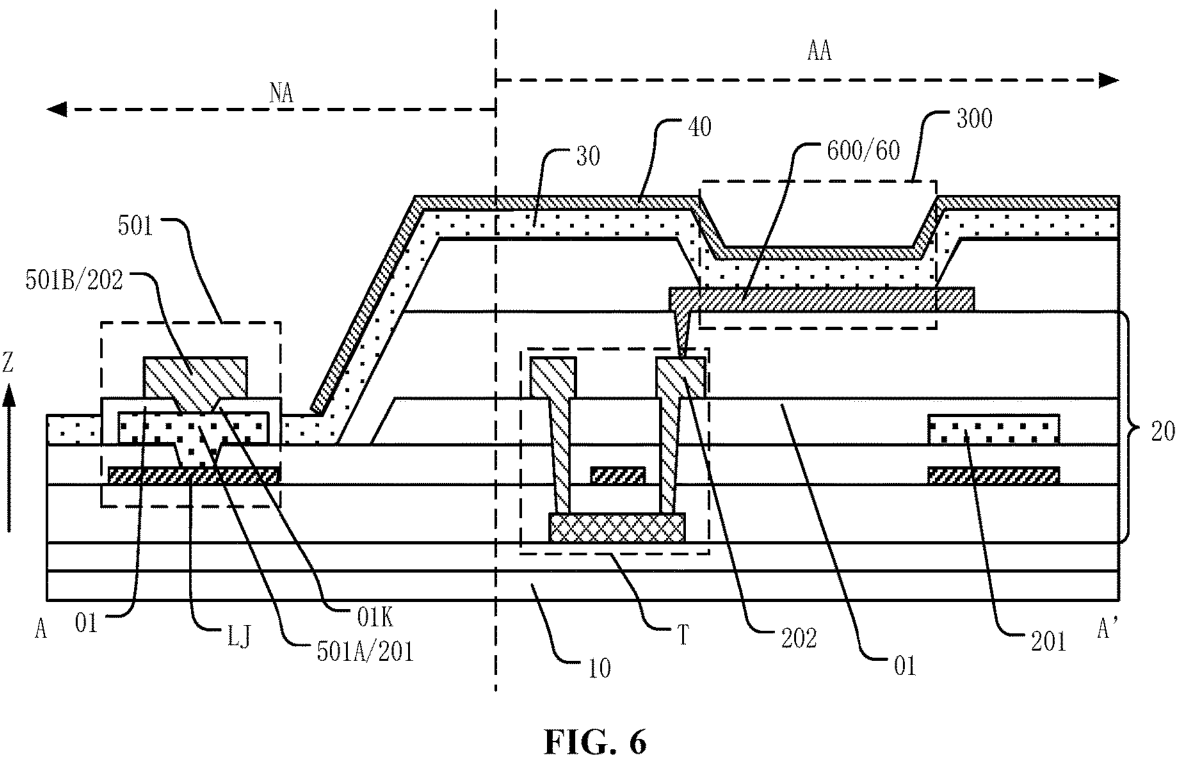
FIG. 6 illustrates another cross-sectional structural view along an A-A' direction in FIG. 1.

It may be understood that the first portion 501A located in the first metal layer 201 may be connected to the ground signal by continuing to be adjoined with other metal layers in the drive circuit layer 20 that are closer to the substrate 10, as shown in FIG. 6. FIG. 6 illustrates another cross-sectional structural view along the A-A' direction in FIG. 1. When the first metal layer 201 is not the metal film layer closest to the substrate 10 in the drive circuit layer 20, a ground wiring LJ may be provided in the metal film layer closest to the substrate 10, and the ground wiring LJ may be used to transmit the ground signal for the first portion 501A to realize the function of conducting away static electricity. Furthermore, the ground wiring LJ disposed in the metal film layer closest to the substrate 10 may also be further stacked with the first portion 501A and the second portion 501B as a part of the first isolation structure 501 to achieve a desirable isolation effect. In one embodiment, the structure of the ground signal of the first portion 501A may not be limited.

Figure 7:
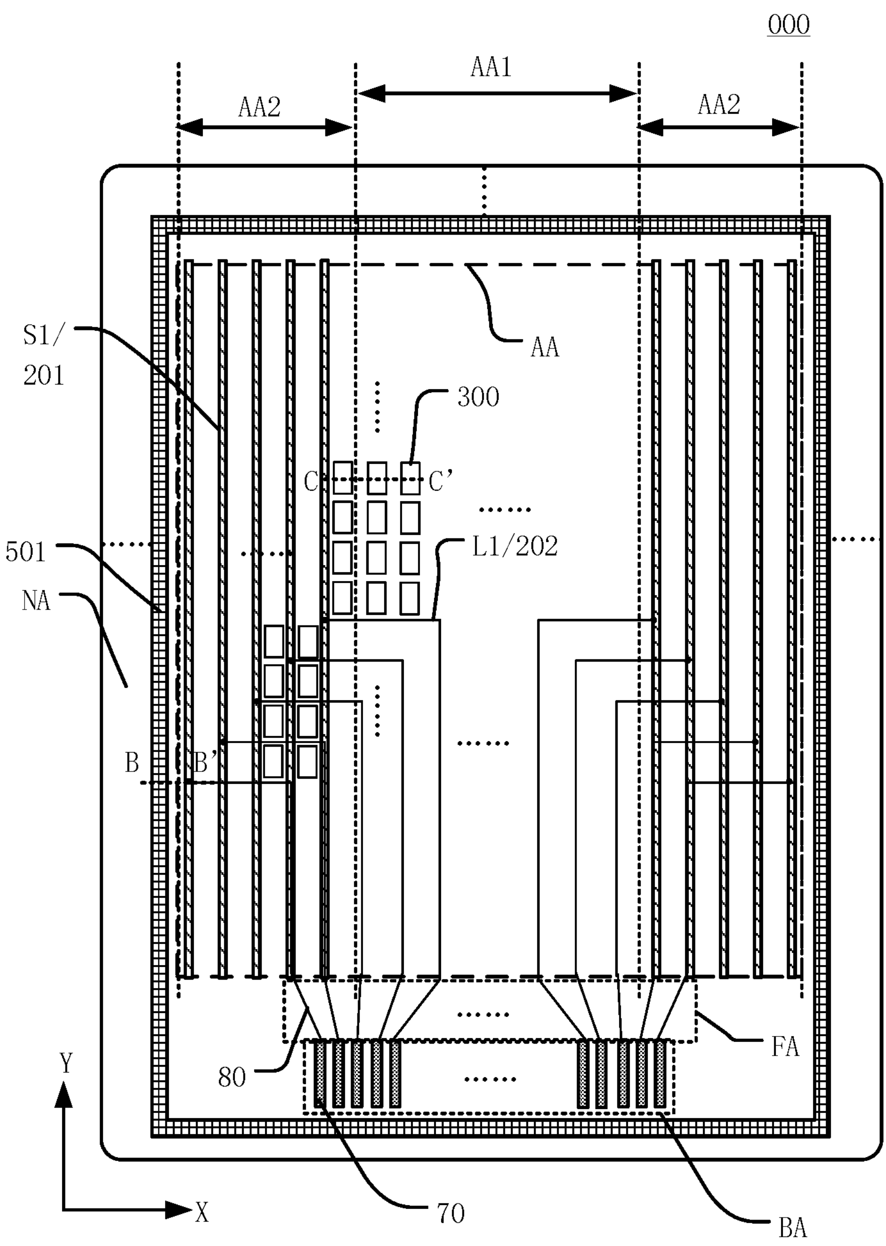
FIG. 7 illustrates another planar structural schematic of a display panel according to various embodiments of the present disclosure.
Figure 8:
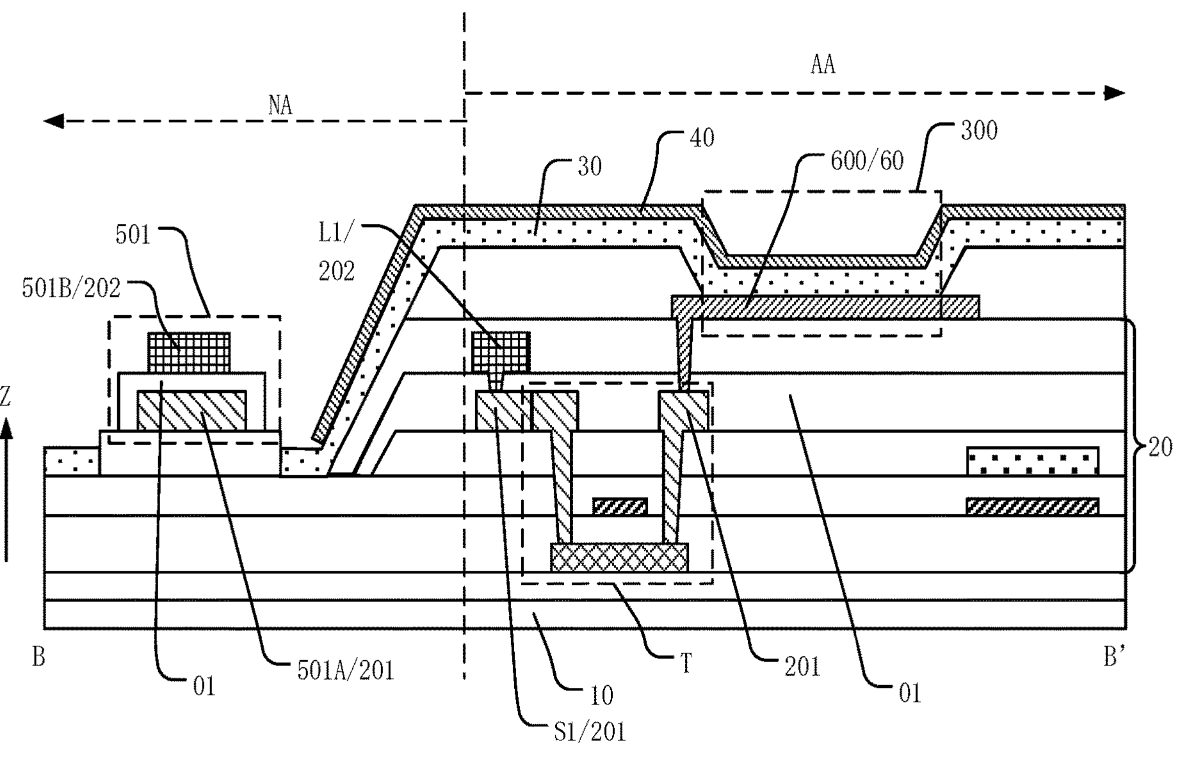
FIG. 8 illustrates a cross-sectional structural view along a B-B' direction in FIG. 7.

In some optional embodiments, referring to FIGS. 7-8, FIG. 7 illustrates another planar structural schematic of the display panel according to various embodiments of the present disclosure; and FIG. 8 illustrates a cross-sectional structural view along a B-B' direction in FIG. 7. In one embodiment, the display region AA may include a plurality of first data lines S1 extending along the first direction Y.

The non-display region NA may include a binding region BA; and the binding region BA may be on one side of the display region AA.

The binding region BA may include a plurality of conductive soldering pads 70; the conductive soldering pad 70 may be electrically connected to the fan-out wiring 80; and the fan-out wiring 80 may be in the non-display region NA.

The first data line S1 may be connected to the fan-out wiring 80 through at least one first connection line L1; and the first connection line L1 may be in the display region AA. The first connection line L1 may be at the second metal layer 202.

In one embodiment, it describes that the non-display region NA of the display panel 000 may further include the binding region BA which may be used to arrange the plurality of conductive soldering pads 70; and the conductive soldering pad 70 may be used for subsequent binding and electrical connection with the driver chip or the flexible circuit board, thereby realizing that display drive signals and the like are provided for the display panel 000 through the driver chip or the flexible circuit board. For example, the binding region BA may include the plurality of conductive soldering pads 70. As shown in FIG. 7, along the first direction Y, the binding region BA may be on one side of the display region AA, and the fan-out region FA may be included between the binding region BA and the display region AA; and the fan-out region FA may be used to dispose the fan-out wiring 80 electrically connecting the signal wires of the display region AA with the conductive soldering pads 70 of the binding region BA. In the display panel 000 of one embodiment, along the second direction X (the second direction X and the first direction Y are perpendicular to each other), the display region AA may include the first display region AA1 and the second display regions AA2 on opposite sides of the first display region AA1. The second display regions AA2 may be understood as the display regions on both sides of the edge of the display panel 000 along the second direction X. The first display region AA1 may be understood as a region closer to the center of the display region AA along the second direction X. The plurality of first data lines S1 extending along the first direction Y in the display panel 000 may be disposed in the second display region AA2. The first data line S1 may be connected to the fan-out wiring 80 of the fan-out region FA through at least one first connection line L1. All fan-out wirings 80 may be then connected to at least part of the conductive soldering pads 70 of the binding region BA to implement signal transmission between the first data lines S1 and the conductive soldering pads 70. In one embodiment, the first connection line L1 may be configured to be in the display region AA, and the fan-out wiring 80 may be configured to be in the fan-out region FA. Disposing the first connection line L1 within the range of the display region AA may prevent the first connection line L1 from occupying the space of the fan-out region FA. As shown in FIG. 7, the first connection line L1 may gradually extend along the direction of the first display region AA1 within the range of the display region AA, and then be connected to the fan-out wiring 80 of the fan-out region FA, such that the fan-out wiring 80 may be as far away from the second display region AA2 as possible along the second direction X, which may be beneficial for reducing the width of the fan-out region FA along the second direction X, and further reducing the lower frame of the display panel 000.

It may be understood that, in one embodiment, the design structure that the first connection line L1 electrically connecting the first data line S1 of the display region AA and the conductive soldering pad 70 of the binding region BA is disposed in the display region AA may satisfy high resolution requirement of the display panel 000. Even if the number of the first data lines S1 is larger, the first connection lines L1 may not need to occupy the space of the fan-out region FA. Therefore, the width of the fan-out region FA along the second direction X may be further reduced, which may satisfy the requirement of high resolution while ensuring display performance and realizing narrower frame.

In one embodiment, the first connection line L1 in the display region AA may be configured to be in the second metal layer 202. The second metal layer 202 where the first connection line L1 is located may be a metal layer other than the metal layer in the drive circuit layer 20 where the gate electrode, the source and drain electrodes and the capacitor of the thin-film transistor T are located. That is, the second metal layer 202 may be a metal film layer on the side of the metal layer where the source and drain electrodes of the thin-film transistor T are located away from the substrate 10. Optionally, at this point, the first data line S1 may be on the first metal layer 201, such that the configuration of the first connection line L1 may be avoided from affecting the structure of the thin-film transistor T, the capacitor, the signal wiring and the like included in the drive circuit layer 20 in the display panel 000. Optionally, when the display panel 000 is an organic light-emitting diode display panel, the film layer of the first connection line L1 may be additionally disposed between the film layer where the anode 600 is located and the film layer where the source and drain electrodes of the thin-film transistor T are located, or may be disposed on other conductive film layers below the anode 600, which may not be limited in one embodiment and may be designed according to actual requirement during implementation. At this point, the second metal layer 202 may be between the film layer where the anode 600 is located and the film layer where the source and drain electrodes of the thin-film transistor T are located and may be relatively adjacent to the light-emitting functional layer 30. Therefore, the second portion 501B of the first isolation structure 501 may be on the second metal layer 202; the top of the first isolation structure 501, that is, the second portion 501B, may be closer to the light-emitting functional layer 30; and the evaporated organic light-emitting material may be more effectively isolated when climbing on the first isolation structure 501, which may prevent the light-emitting portion 300 of the display region AA from being affected by water and oxygen to cause light-emitting failure, thereby ensuring the display quality of the display panel 000.

It may be understood that, in one embodiment, specific structure of the first connection line L1 may not be described in detail and may be understood by referring to the structure of the fan-out line arranged in the display region in the existing technology, which may only need to satisfy that the film layer of the second portion 501B in one embodiment is on same layer as the first connection line L1.

Figure 9:
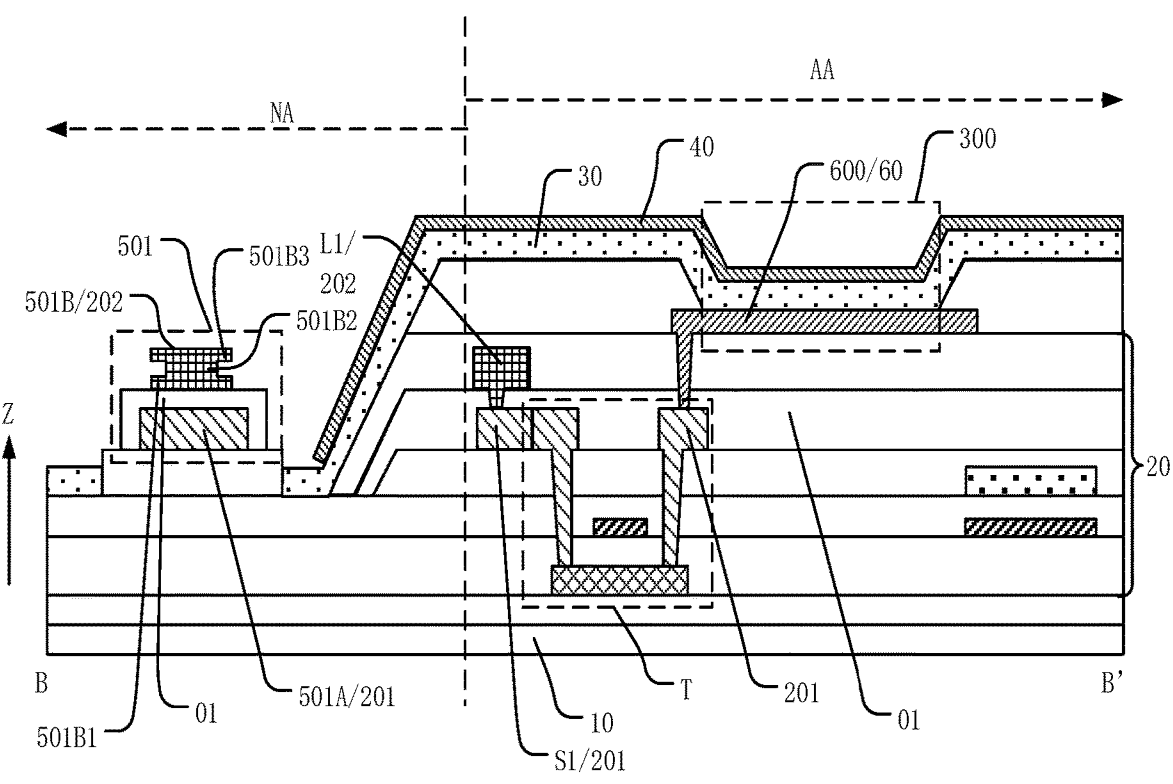
FIG. 9 illustrates another cross-sectional structural view along a B-B' direction in FIG. 7.

Optionally, referring to FIGS. 7 and 9, FIG. 9 illustrates another cross-sectional structural view along the B-B' direction in FIG. 7. The second portion 501B of the first isolation structure 501 may be formed by using the film layer of the first connection line L1 included in the display panel 000 itself. At this point, the second metal layer 202 may not need to form other conductive structures except the first connection line L1. Therefore, the second portion 501B on the second metal layer 202 may use a side etching process to form a recessed structure in the side region of the second portion 501B. The side-etched second portion 501B may be further stacked with the first portion 501A to form the first isolation structure 501, which may further effectively block climbing of the light-emitting functional layer 50, thereby more effectively preventing water and oxygen from intruding into the display region AA and affecting the display effect.

Optionally, in one embodiment, when the second portion 501B on the second metal layer 202 uses the side etching process to form the recessed structure in the side region of the second portion 501B, the side etching process and the process of forming the first connection line L1 may not affect each other, and the first connection line L1 may only need to realize the electrical connection between the first data line S1 and the conductive soldering pad 70 without breaking in the process. Furthermore, the side etching value of the second portion 501B formed by the side engraving process may not be affected by technological requirements of the wiring of the first connection line L1 in the display region AA as possible. That is, the side etching value of the second portion 501B may be adjusted, such that the recess degree in the side region of the second portion 501B may be as high as possible, which may improve the blocking effect of the first isolation structure 501 and effectively block the passage of water vapor and oxygen intrusion.

Figure 10:
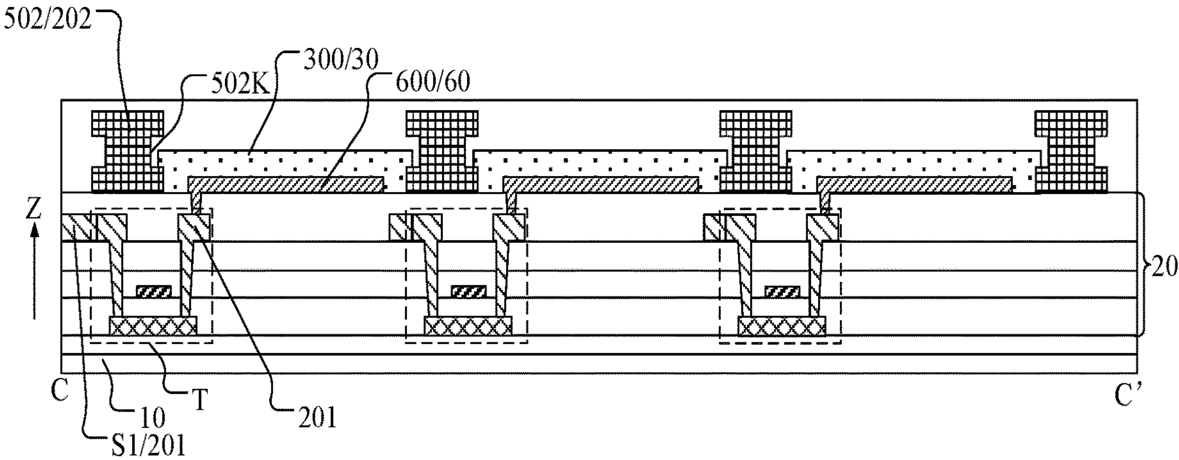
FIG. 10 illustrates a cross-sectional structural view along a C-C' direction in FIG. 7.

In some optional embodiments, referring to FIGS. 7 and 10, FIG. 10 illustrates a cross-sectional structural view along a C-C' direction in FIG. 7. It may be understood that, in order to clearly illustrate the structure in one embodiment, the second isolation structure may not be shown in FIG. 7. In one embodiment, an anode layer 60 may be included between the second metal layer 202 and the light-emitting functional layer 30; the anode layer 60 may include a plurality of anodes 600; and at least one anode 600 may correspond to one light-emitting portion 300.

The second metal layer 202 may include a plurality of second isolation structures 502 which may be in the display region AA.

The second isolation structure 502 may be between two adjacent anodes 600; a plurality of openings 502K may be formed at the second isolation structure 502; at least a part of the light-emitting portion 300 and the anode 600 may be in the opening 502K; the light-emitting portion 300 may cover the anode 600; and the anode 600 and the second isolation structure 502 may be insulated by the light-emitting portion 300.

In one embodiment, it describes that the anode layer 60 may be included between the second metal layer 202 and the light-emitting functional layer 30; the anode layer 60 may include the plurality of anodes 600; and at least one anode 600 may correspond to one light-emitting portion 300. In the formation process of the display panel 000, after the structure of the second metal layer 202 such as the second isolation structure 502 is formed, the anode 600 of the anode layer 60 may be formed between two adjacent second isolation structures 502; and the light-emitting functional layer 30 may be evaporated by an evaporation process, and the light-emitting portions 300 which are independent from each other may be formed between two adjacent second isolation structures 502. In one embodiment, the second isolation structure 502 between two adjacent anodes 600 may include the opening 502K; the opening 502K may be formed by the side etching process which is consistent with the process of the second portion 501B; and the side etching process may make partial side region of the second isolation structure 502 recessed to form the opening 502K. Furthermore, subsequent formed anode 600 may be between two adjacent second isolation structures 502 to correspond to one sub-pixel. At least a part of the light-emitting portion 300 and the anode 600 may be in the opening 502K. The light-emitting portion 300 covers the anode 600, such that the light-emitting portion 300 may insulate the anode 600 from the second isolation structure 502. Moreover, the second isolation structure 502 in one embodiment may include the structure of the opening 502K, which may effectively isolate different light-emitting portions 300 corresponding to different sub-pixels. In such way, evaporated organic light-emitting material may be isolated at the position of the second isolation structure 502, which may avoid crosstalk between the light-emitting portions 300 of different colors.

In one embodiment, the formation process of the display panel 000 may be that after the thin-film transistor T structure of the drive circuit layer 20 is formed, the second metal layer 202 may be formed, and the second portion 501B and the second isolation structure 502 may be formed through photolithography and side etching processes; and the anode 600 of the anode layer 60 may be formed between two adjacent second isolation structures 502, and the light-emitting functional layer 30 may be evaporated by an evaporation process. The light-emitting portions 300 of different colors in the display region AA may be isolated by the second isolation structure 502, and the light-emitting functional layer 30 of the non-display region NA may be isolated by the first isolation structure 501, which may avoid crosstalk between the light-emitting portions 300 of different colors in the display region AA and further block the intrusion of water and oxygen from the non-display region NA to the display region AA, thereby improving the display quality of the display panel 000. In one embodiment, the structure of the pixel definition layer PDL in FIG. 2 may be further replaced by the second isolation structure 502 to omit the process technology of the pixel definition layer PDL, which may be beneficial to simplify process steps, reduce cost, improve process efficiency and achieve the effect of improving display quality.

Figure 11:
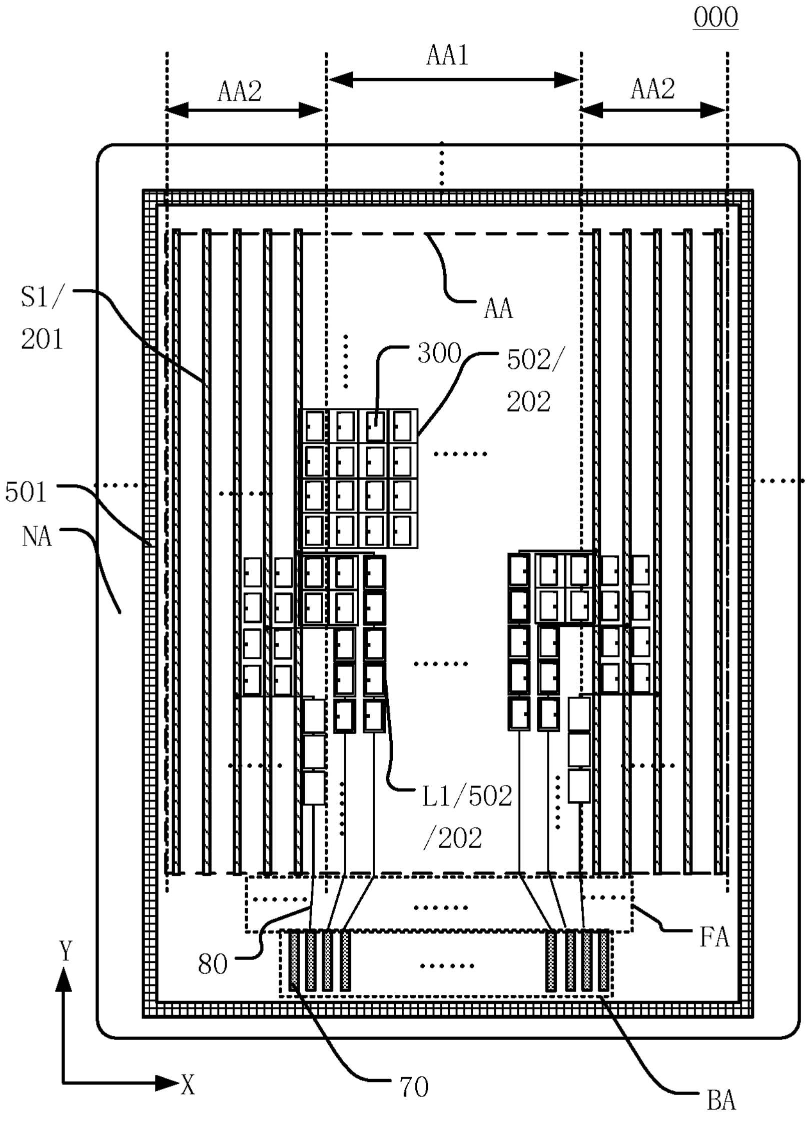
FIG. 11 illustrates another planar structural schematic of a display panel according to various embodiments of the present disclosure.
Figure 12:
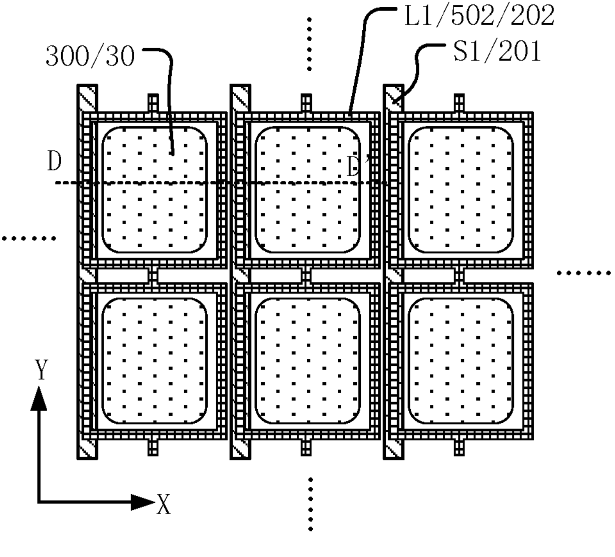
FIG. 12 illustrates an enlarged schematic of a partial display region in FIG. 11.
Figure 13:
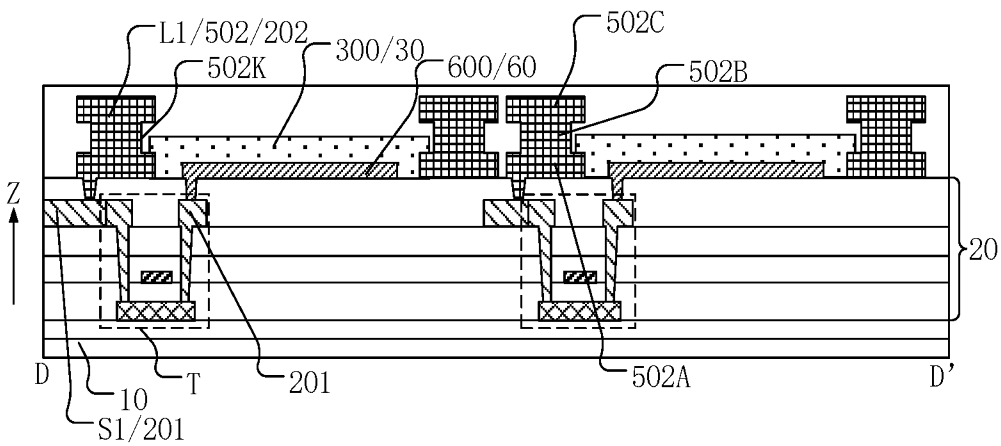
FIG. 13 illustrates a cross-sectional structural view along a D-D' direction in FIG. 12.

In some optional embodiments, referring to FIGS. 11-13, FIG. 11 illustrates another planar structural schematic of the display panel according to various embodiments of the present disclosure; FIG. 12 illustrates an enlarged schematic of a partial display region in FIG. 11; and FIG. 13 illustrates a cross-sectional structural view along a D-D' direction in FIG. 12. In one embodiment, the orthographic projection of the first connection line L1 on the plane of the display panel 000 may be at least not partially overlapped with the orthographic projection of the light-emitting portion 300 on the plane of the display panel 000; and a part of the first connection line L1 may be multiplexed as the second isolation structure 502.

In one embodiment, it describes that when the second metal layer 202 is used to form the first connection line L1 in the display region AA, the first connection line L1 may gradually extend along the direction adjacent to the first display region AA1 within the range of the display region AA and then be connected to the fan-out wiring 80 of the fan-out region which may reduce the width of the fan-out region FA along the second direction X and further reduce the lower frame of the display panel 000, and the first connection line L1 located in the display region AA may be partially arranged around the light-emitting portion 300. That is, the orthographic projection of the first connection line L1 on the plane of the display panel 000 may be configured to be at least not partially overlapped with the orthographic projection of the light-emitting portion 300 on the plane of the display panel 000; and the first connection line L1 not overlapping with the light-emitting portion 300 may be configured to around the light-emitting portion 300. At this point, at the position of the first connection line L1 in the display panel 000, a part of the first connection line L1 may be multiplexed as the second isolation structure 502; and the second isolation structure 502 in other positions may be still the structure surrounding the light-emitting portion 300 shown in FIG. 11. In such way, it is beneficial to reduce the structure of the second metal layer 202 in the display region AA, and there is no need to form both the first connection line L1 and the second isolation structure 502 on the second metal layer 202. The region with the first connection line L1 may be directly used as the second isolation structure 502 to provide more spatial layout for the second metal layer 202 and prevent structures on the second metal layer 202 from significantly affecting the light-emitting quality of the light-emitting portion 300. Moreover, a part of the first connection line L1 may be reused as the second isolation structure 502, which may also reduce the formation process of the second metal layer 202 and improve the formation efficiency of overall display panel 000.

It may be understood that, in one embodiment, the arrangement structure of the first connection line L1 on the periphery of the light-emitting portion 300 may be only illustrated by taking the array arrangement of the plurality of light-emitting portions 300 as an example in the drawings. During an implementation, the arrangement of the plurality of light-emitting portions 300 may also be arranged in a non-array arrangement to improve the display effect through the sub-pixel structure arranged in a non-array arrangement, which may not be described in detail in one embodiment and may be understood with reference to the arrangement manner of sub-pixels in the existing technology.

It may be understood that, in order to clearly illustrate the structure of one embodiment, the electrical connection between the first connection line L1 and the first data line S1 may not be shown in FIG. 12. During an implementation, the first connection line L1 and the first data line S1 of different layers may be electrically connected through a via hole. That is, at least one via hole may be used to realize the electrical connection effect between the first connection line L1 multiplexed as the second isolation structure 502 and corresponding first data line S1, which may not be described in detail in one embodiment.

Optionally, referring to FIGS. 11-13, in one embodiment, along the direction Z perpendicular to the plane of the display panel 000, the second isolation structure 502 may include a first sub-line 502A, a second sub-line 502B and a third sub-line 502C which are configured to be stacked with each other; the second sub-line 502B may be between the first sub-line 502A and the third sub-line 502C; and the width of the second sub-line 502B may be less than each of the width of the first sub-line 502A and the width of the third sub-line 502C.

In one embodiment, it describes that the second metal layer 202 in the display region AA may include the second isolation structure 502; and when the second metal layer 202 is used to form the first connection line L1 in the display region AA to reduce the lower frame of the display panel 000 through disposing the first connection line L1 in the display region AA, at least a part of the first connection line L1 may be multiplexed as the second isolation structure 502 of the display region AA. At this point, the second isolation structures 502 (including the first connection line L1 multiplexed as the second isolation structure 502) in the display region AA may be all configured as partially recessed structures. For example, along the direction Z perpendicular to the plane of the display panel 000, the second isolation structure 502 may include the first sub-line 502A, the second sub-line 502B, and the third sub-line C502 which are configured to be stacked with each other; the second sub-line 502B may be between the first sub-line 502A and the third sub-line 502C; and the width of the second sub-line 502B may be less than each of the width of the first sub-line 502A and the width of the third sub-line 502C. In addition, the orthographic projection of the second sub-line 502B on the plane of the display panel 000 may be within the range of the orthographic projection of the first sub-line 502A on the plane of the display panel 000, and the orthographic projection of the second sub-line 502B on the plane of the display panel 000 may be within the range of the orthographic projection of the third sub-line 502C on the plane of the display panel 000, thereby forming a structure that the side of the second isolation structure 502 is partially recessed. The side-etched shape of the second isolation structure 502 may be formed by the structure in which the side of the second isolation structure 502 is partially recessed. The organic light-emitting material corresponding to each sub-pixel (that is, the light-emitting portion 300) may be isolated more effectively through side-etched second isolation structure 502 which may avoid local color mixing and improve display quality.

Optionally, the second portion 501B of the first isolation structure 501 in one embodiment may be formed using the second metal layer 202. Therefore, the second portion 501B of the first isolation structure 501 in the non-display region NA may be formed in a same process as the second isolation structure 502 in the display region AA (not shown in drawings). The second portion 501B may also form into the structure that the side of the second isolation structure 502 is partially recessed through the side etching process. Furthermore, the side-etched second portion 501B and the first portion 501A may be further stacked to form the first isolation structure 501, which may further effectively block the climbing of the light-emitting functional layer 50, and more effective prevent water and oxygen from intruding into the display region AA to affect the display effect.

In some optional embodiments, referring to FIGS. 7 and 9, along the direction Z perpendicular to the plane of the display panel 000, the second portion 501B may include a first sub-portion 501B1, a second sub-portion 501B2, and a third sub-portion 501B3 which are configured to be stacked with each other; and the second sub-portion 501B2 may be between the first sub-portion 501B1 and the third sub-portion 501B3.

The orthographic projection of the first sub-portion 501B1 on the plane of the display panel 000 may cover the orthographic projection of the second sub-portion 501B2 on the plane of the display panel 000. The orthographic projection of the third sub-portion 501B3 on the plane of the display panel 000 may cover the orthographic projection of the second sub-portion 501B2 on the plane of the display panel 000.

The area of the orthographic projection of the second sub-portion 501B2 on the plane of the display panel 000 may be less than the area of the orthographic projection of the first sub-portion 501B1 on the plane of the display panel 000. The area of the orthographic projection of the second sub-portion 501B2 on the plane of the display panel 000 may be less than the area of the orthographic projection of the third sub-portion 501B3 on the plane of the display panel 000.

In one embodiment, it describes that in the structure of the first isolation structure 501 in the non-display region NA, the second portion 501B in the second metal layer 202 may be a structure in which multiple sub-portions are stacked with each other. For example, along the direction Z perpendicular to the plane of the display panel 000, the second portion 501B may include the first sub-portion 501B1, the second sub-portion 501B2, and the third sub-portion 501B3 which are configured to be stacked with each other; and the area of the second sub-portion 501B2 at the middle may be less than the area of each of the first sub-portion 501B1 at the lower layer and the third sub-portion 501B3 at the upper layer, such that the side surface of the second portion 501B of the first isolation structure 501 may form the side-etched structure through narrower second sub-portion 501B2. The side-etched second portion 501B may be further stacked with the first portion 501A to form the first isolation structure 501, which may further effectively block the climbing of the light-emitting functional layer 50 and more effective prevent water and oxygen from intruding into the display region AA to affect the display effect.

Optionally, referring to FIGS. 7 and 9, the drive circuit layer 20 may include a plurality of metal layers. Along the direction perpendicular to the plane of the display panel 000, the distance from the second metal layer 202 to the light-emitting functional layer 30 may be less than the distance from other metal layers of the drive circuit layer 20 to the light-emitting functional layer 30.

In one embodiment, it describes that the second metal layer 202 used to form the second portion 501B of the first isolation structure 501 may be the metal layer closest to the light-emitting functional layer 30 in the drive circuit layer 20. That is, the drive circuit layer 20 includes the plurality of metal layers; however, along the direction perpendicular to the plane of the display panel 000, the distance from the second metal layer 202 of the second portion 501B to the light-emitting functional layer 30 may be less than the distance from other metal layers of the drive circuit layer 20 to the light-emitting functional layer 30. The second metal layer 202 may be closer to the light-emitting functional layer 30 than other metal layers in the drive circuit layer 20, so that the second portion 501B of the first isolation structure 501 may be located on the second metal layer 202. Furthermore, the second portion 501B may form the side-etched structure through narrower second sub-portion 501B2, such that when the top of the first isolation structure 501, that is, the second portion 501B, is closest to the light-emitting functional layer 30, deposited organic light-emitting material may be more effectively isolated when climbing on the first isolation structure 501. Therefore, the light-emitting portion 300 of the display region AA may be prevented from being affected by water and oxygen to fail to emit light, and the display quality of the display panel 000 may be ensured.

Optionally, the second metal layer 202 in one embodiment may be made of various metal materials. That is, when forming the second metal layer 202, the second sub-portion 501B2 may be made of a material different from the material the first sub-portion 501B1, and the first sub-portion 501B1 may be made of a material same as the material of the third sub-portion 501B3. For example, the formation material of the second sub-portion 501B2 may include an aluminum metal material, and the formation material of the first sub-portion 501B1 and the third sub-portion 501B3 may include a titanium metal material. The second metal layer 202 may be a film structure in which titanium, aluminum, and titanium are stacked with each other. In such way, it may not only reduce the impedance of the first connection line L1 made by the second metal layer 202 which is beneficial to signal transmission, but also reduce process difficulty of forming the first sub-portion 501B1, the second sub-portion 501B2, and the third sub-portion 501B3. When the second portion 501B of the first isolation structure 501 is formed and the second portion 501B is the structure that the side of the second isolation structure 502 is partially recessed, the side etching process may not be needed. After wider first sub-portion 501B1 of the titanium metal material is formed, narrower second sub-portion 501B2 of the aluminum metal material may be formed, and finally, wider third sub-portion 501B3 of the titanium metal material may be completed. Furthermore, the passage of water and oxygen invading the display region AA may be effectively blocked, and the process efficiency of the second portion 501B may also be improved.

Figure 14:
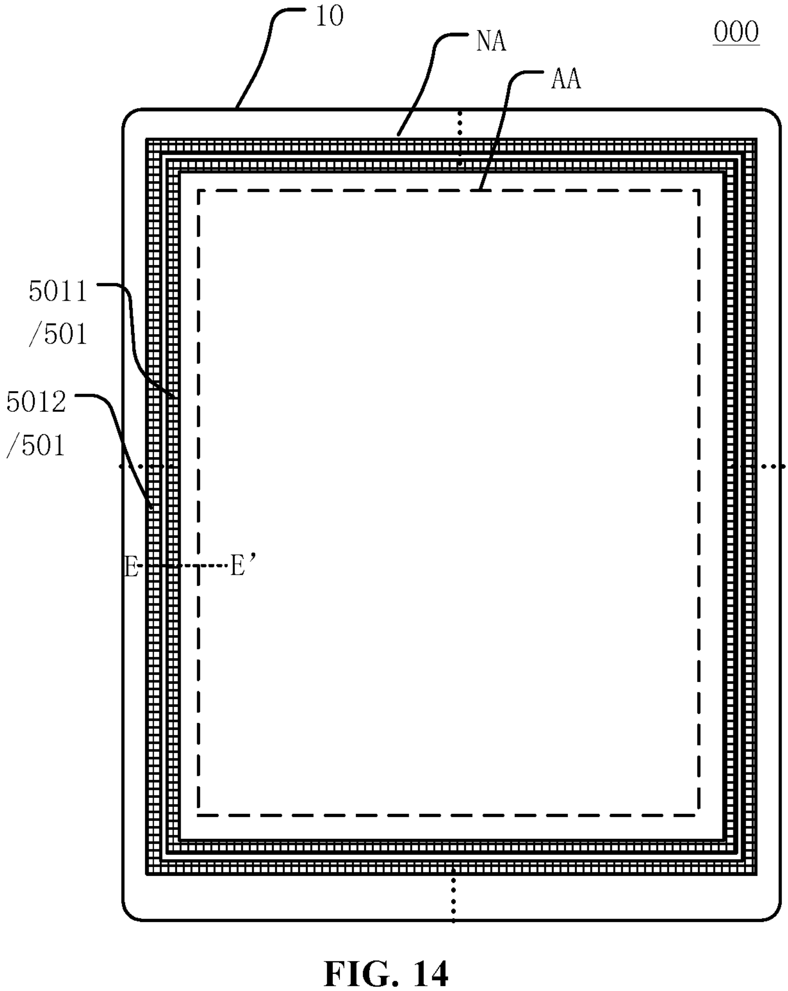
FIG. 14 illustrates another planar structural schematic of a display panel according to various embodiments of the present disclosure.
Figure 15:
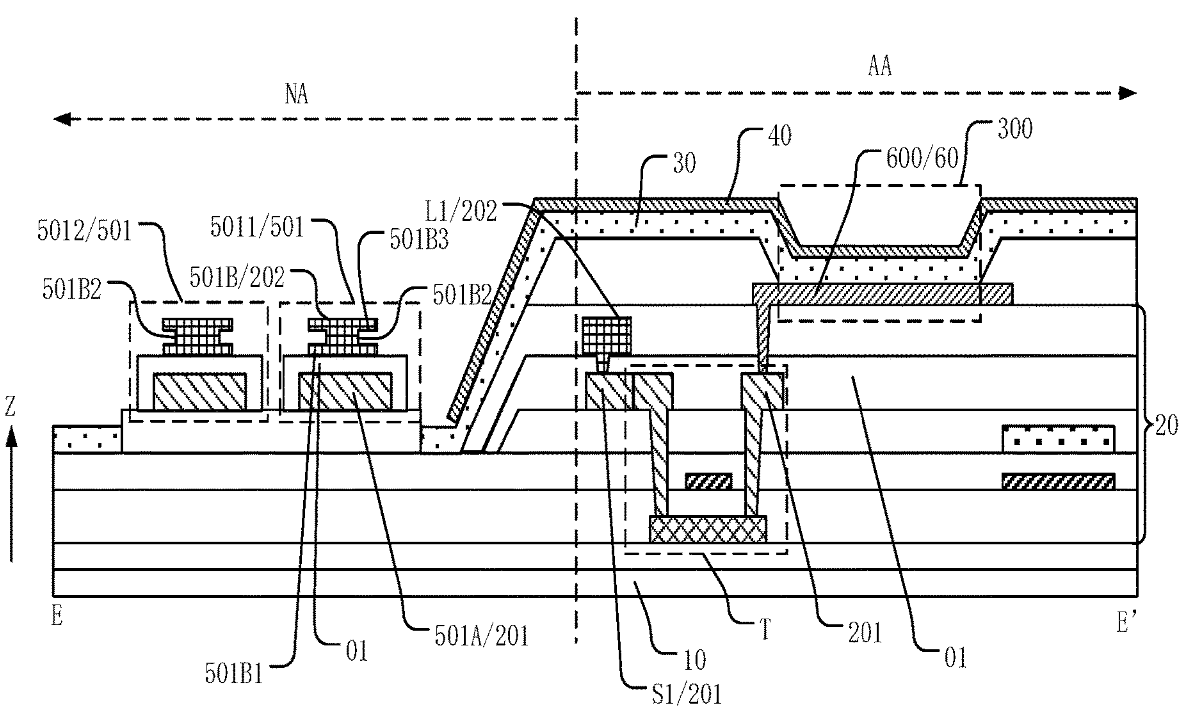
FIG. 15 illustrates a cross-sectional structural view along an E-E' direction in FIG. 14.

In some optional embodiments, referring to FIGS. 14-15, FIG. 14 illustrates another planar structural schematic of the display panel according to various embodiments of the present disclosure; and FIG. 15 illustrates a cross-sectional structural view along an E-E' direction in FIG. 14. In one embodiment, the plurality of first isolation structures 501 may include a first sub-isolation structure 5011 and a second sub-isolation structure 5012; and along the direction from the display region AA to the non-display region NA, the first sub-isolation structure 5011 may be on the side of the second sub-isolation structure 5012 adjacent to the display region AA.

The area of the orthographic projection of the second sub-portion 501B2 of the first sub-isolation structure 5011 on the plane of the display panel 000 may be less than the area of the orthographic projection of the second sub-portion 501B2 of the second sub-isolation structure 5012 on the plane of the display panel 000.

In one embodiment, it describes that the plurality of first isolation structures 501 arranged side by side may be configured in the non-display region NA to improve the effect of blocking water and oxygen from intruding into the display region AA. In addition, in one embodiment, the plurality of first isolation structures 501 may at least include the first sub-isolation structure 5011 and the second sub-isolation structure 5012; along the direction from the display region AA to the non-display region NA, the first sub-isolation structure 5011 may be closer to the display region AA than the second sub-isolation structure 5012; and the area of the orthographic projection of the second sub-portion 501B2 of the first sub-isolation structure 5011 on the plane of the display panel 000 may be less than the area of the orthographic projection of the second sub-portion 501B2 of the second sub-isolation structure 5012 on the plane of the display panel 000. The closer to the display region AA is, the deeper the side etching of the second portion 501B is, that is, the smaller the area of the second sub-portion 501B2 is. Furthermore, optionally, the area of the orthographic projection of the first sub-portion 501B1 of the first sub-isolation structure 5011 on the plane of the display panel 000 may be equal to the area of the orthographic projection of the first sub-portion 501B1 of the second sub-isolation structure 5012 on the plane of the display panel 000; and the area of the orthographic projection of the third sub-portion 501B3 of the first sub-isolation structure 5011 on the plane of the display panel 000 may be equal to the area of the orthographic projection of the third sub-portion 501B3 of the second sub-isolation structure 5012 on the plane of the display panel 000. The deeper the recession of the side region of the second portion 501B is, the better the blocking effect is, thereby further improving the display quality and production yield.

Figure 16:
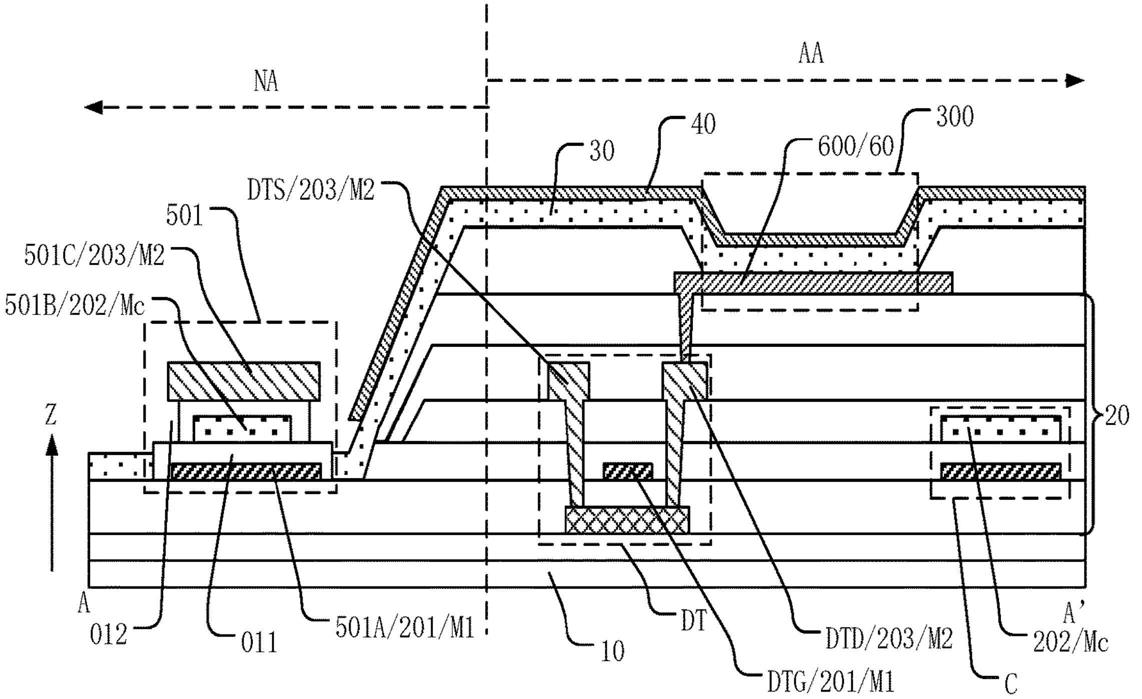
FIG. 16 illustrates another cross-sectional structural view along an A-A' direction in FIG. 1.

In some optional embodiments, referring to FIGS. 1 and 16, FIG. 16 illustrates another cross-sectional structural view along an A-A' direction in FIG. 1. In one embodiment, the drive circuit layer 20 may further at least include a third metal layer 203, where the third metal layer 203 may be on the side of the second metal layer 202 away from the substrate 10; and the drive circuit layer 20 may include a plurality of drive transistors DT and capacitors C, where the gate electrode DTG of the drive transistor DT may be at the first metal layer 201, one electrode of the capacitor C may be at the second metal layer 202, and the source electrode DTS and the drain electrode DTD of the drive transistor DT may be at the third metal layer 203.

Along the direction Z perpendicular to the plane of the display panel 000, the first isolation structure 501 may further include a third portion 501C on the side of the second portion 501B away from the first portion 501A.

The third portion 501C may be at the third metal layer 203.

The orthographic projection of the first portion 501A on the plane of the display panel 000 may cover the orthographic projection of the second portion 501B on the plane of the display panel 000. The orthographic projection of the third portion 501C on the plane of the display panel 000 may cover the orthographic projection of the second portion 501B on the plane of the display panel 000.

The area of the orthographic projection of the second portion 501B on the plane of the display panel 000 may be less than the area of the orthographic projection of the first portion 501A on the plane of the display panel 000. The area of the orthographic projection of the second portion 501B on the plane of the display panel 000 may be less than the area of the orthographic projection of the third portion 501C on the plane of the display panel 000.

In one embodiment, it describes that the drive circuit layer 20 of the display panel 000 may include the plurality of metal layers. For example, when the drive circuit layer 20 uses the plurality of metal layers to form the drive transistor DT and capacitor C of the pixel circuit, the gate electrode DTG of the drive transistor DT may be at the first metal layer 201 which may be understood as the gate metal layer M1; one electrode of the capacitor C may be at the second metal layer 202 which may be understood as the capacitor metal layer Mc; and the source electrode DTS and the drain electrode DTD of the drive transistor DT may be at the third metal layer 203 which may be understood as the source-drain metal layer M2. The first isolation structure 501 disposed in the non-display region NA may further include the third portion 501C. Along the direction Z perpendicular to the plane of the display panel 000, the third portion 501C of the first isolation structure 501 may be on the side of the second portion 501B of the first isolation structure 501 away from the first portion 501A of the first isolation structure 501. That is, the first isolation structure 501 may be a three metal layer stacked design of the first metal layer 201, the second metal layer 202, and the third metal layer 203 (the gate metal layer M1, the capacitor metal layer Mc, and the source and drain metal layer M2). The first isolation structure 501 may be formed by the plurality of metal layers stacked with each other. Furthermore, the side etching process may not be applied on the side region of the first isolation structure 501; the third portion 501C of the upper layer and the first portion 501A of the lower layer may be configured to be wider; and the second portion 501B of the middle layer may be configured to be narrower. Furthermore, the side etching process may be avoided, and the manner of side etching a certain sub-layer in the single-layer metal may not be used, which may reduce process difficulty, save time and effort, and directly use width difference of different metal layers to effectively isolate evaporated material.

It may be understood that when evaporating the organic light-emitting material of the display panel 000, evaporated organic light-emitting material may be excessively thin to be in nanoscale. If a single layer of metal is used, such as only the second portion 501B of the second metal layer 202, to form a partial region depression through the side etching, the depth of the side etching may be only a few tenths of a micron. Moreover, if the depth of the side etching is excessively deep, the non-recessed region on the side of the second portion 501B may sink, which may affect the process accuracy of the second portion 501B. However, in one embodiment, the three metal layer stacked design, where the layers may include the first metal layer 201, the second metal layer 202, and the third metal layer 203 (the gate metal layer M1, the capacitance metal layer Mc, the source and drain metal layer M2), may be used to form the first isolation structure 501 including the first portion 501A, the second portion 501B, and the third portion 501C which are stacked with each other. In such way, overall thickness may be at the micron level, and difference in thickness may be relatively large, which may be more difficult for climbing of evaporated organic light-emitting material. For example, the third portion 501C in the third metal layer 203 may be made wider than the boundary of the second portion 501B of the second metal layer 202 by a few microns. That is, the second portion 501B may be narrower than the third portion 501C from a few tenths of a micron to several microns in the side etching process, which may have desirable blocking effect, further block the intrusion of water and oxygen, and improve the display quality while reducing process difficulty.

Optionally, referring to FIGS. 1 and 16, in one embodiment, the first insulating layer 011 may be disposed between the first metal layer 201 and the second metal layer 202, and the second insulating layer 012 may be disposed between the second metal layer 202 and the third metal layer 203. In such way, the first portion 501A and the second portion 501B may be separated and insulated by a part of the first insulating layer 011; and the second portion 501B and the third portion 501C may be separated and insulated by a part of the second insulating layer 012, which is equivalent to raising the first isolation structure 501 to achieve a better isolation effect.

Figure 17:
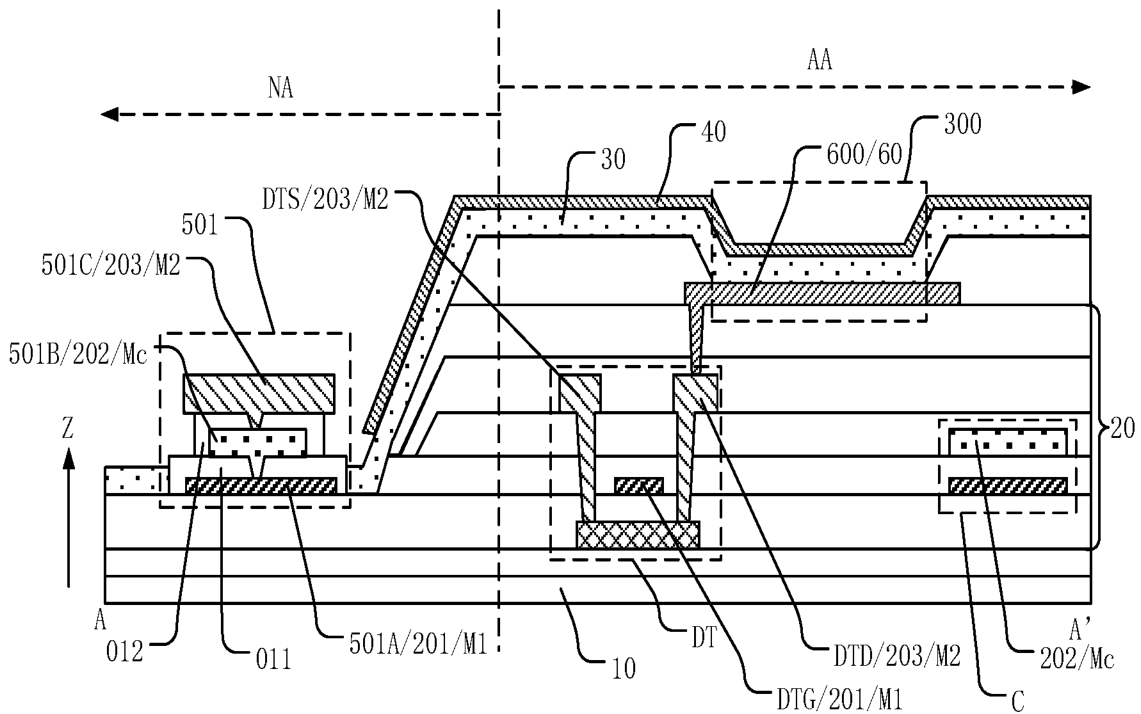
FIG. 17 illustrates another cross-sectional structural view along an A-A' direction in FIG. 1.

Optionally, referring to FIGS. 1 and 17, FIG. 17 illustrates another cross-sectional structural view along thee A-A' direction in FIG. 1. The first insulating layer 011 may be disposed between the first metal layer 201 and the second metal layer 202; and the second insulating layer 012 may be disposed between the second metal layer 202 and the third metal layer 203. However, at the position of the first isolation structure 501, the third portion 501C, the second portion 501B, and the first portion 501A may be contacted, adjoined and connected with each other by forming hollow portions on the first insulating layer 011 and the second insulating layer 012. The first portion 501A on the first metal layer 201 may be configured to be connected the ground signal during the use of the display panel 000. The second portion 501B in the second metal layer 202 may be electrically connected to the first portion 501A of the lower layer, which is equivalent to that the second portion 501B is also connected to the ground signal. The third portion 501C in the third metal layer 203 may be electrically connected to the first portion 501A of the lower layer, which is equivalent to that the third portion 501C is also connected to the ground signal. Therefore, static electricity in each film layer of the display panel 000 or entered static electricity when cutting the edge of the panel may be guided away in time, which may realize electrostatic protection effect on the display panel 000, thereby being beneficial for ensuring the display quality.

Figure 18:
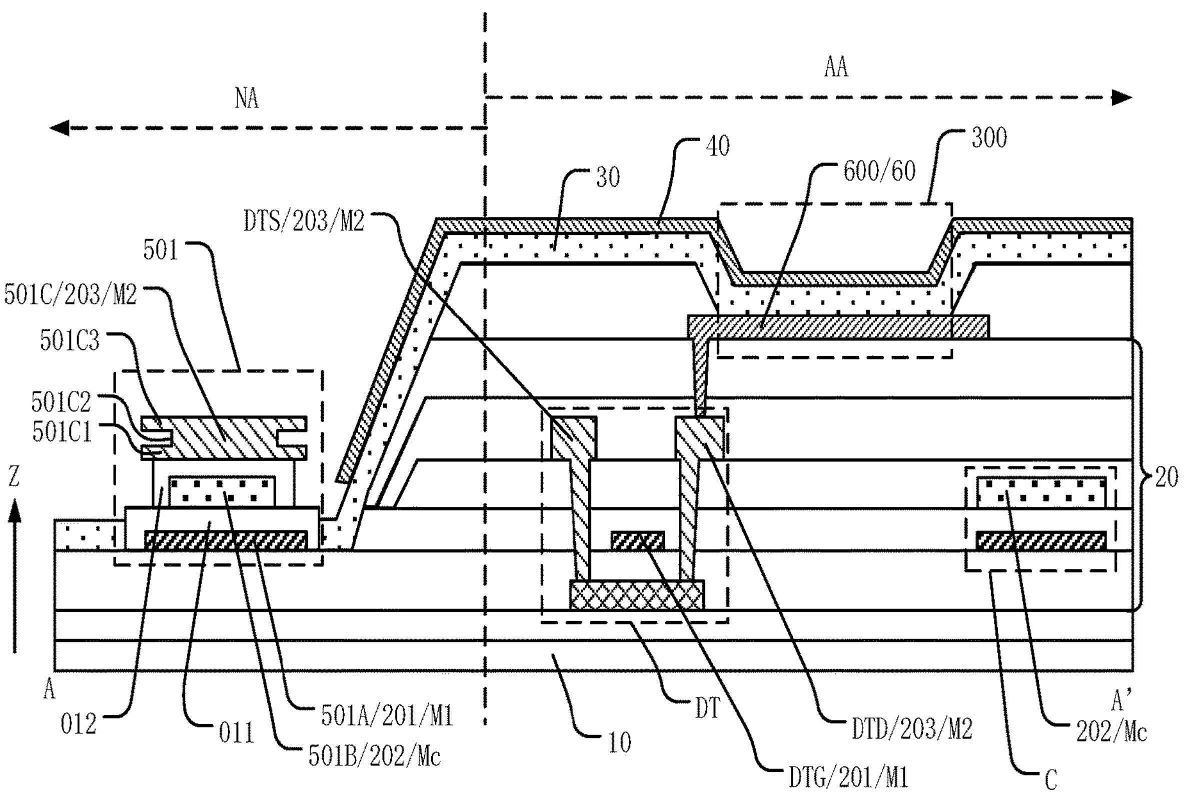
FIG. 18 illustrates another cross-sectional structural view along an A-A' direction in FIG. 1.

In some optional embodiments, referring to FIGS. 1 and 18, FIG. 18 illustrates another cross-sectional structural view along the A-A' direction in FIG. 1. In one embodiment, along the direction Z perpendicular to the plane of the display panel 000, the third portion 501C may include a fourth sub-portion 501C1, a fifth sub-portion 501C2, and a sixth sub-portion 501C3 which are configured to be stacked with each other; and the fifth sub-portion 501C2 may be between the fourth sub-portion 501C1 and the sixth sub-portion 501C3.

The orthographic projection of the fourth sub-portion 501C1 on the plane of the display panel 000 may cover the orthographic projection of the fifth sub-portion 501C2 on the plane of the display panel 000. The orthographic projection of the sixth sub-portion 501C3 on the plane of the display panel 000 may cover the orthographic projection of the fifth sub-portion 501C2 on the plane of the display panel 000.

The area of the orthographic projection of the fifth sub-portion 501C2 on the plane of the display panel 000 may be less than the area of the orthographic projection of the fourth sub-portion 501C1 on the plane of the display panel 000. The area of the orthographic projection of the fifth sub-portion 501C2 on the plane of the display panel 000 may be less than the area of the orthographic projection of the sixth sub-portion 501C3 on the plane of the display panel 000.

In one embodiment, it describes that the first isolation structure 501 may be a three metal layer stacked design of the first metal layer 201, the second metal layer 202, and the third metal layer 203 (the gate metal layer M1, the capacitor metal layer Mc, the source and drain metal layer M2). The first isolation structure 501 formed by stacking the plurality of metal layers may directly make the third portion 501C of the upper layer and the first portion 501A of the lower layer to be wider and make the second portion 501B of the middle layer to be narrower, which may further configure the third portion 501C on the third metal layer 203 as a structure that the plurality of sub-portions are stacked with each other. For example, along the direction Z perpendicular to the plane of the display panel 000, the third portion 501C may include the fourth sub-portion 501C1, the fifth sub-portion 501C2, and the sixth sub-portion 501C3 which are configured to be stacked with each other. The area of the fifth sub-portion 501C2 in the middle may be less than the area of each of the fourth sub-portion 501C1 of the lower layer and the sixth sub-portion 501C3 of the upper layer. In such way, the side-etched structure may be formed at the side surface of the third portion 501C of the first isolation structure 501 through narrower fifth sub-portion 501C2. The side-etched third portion 501C may be further stacked with the second portion 501A and the first portion 501A to form the first isolation structure 501, which may further effectively block the climbing of the light-emitting functional layer 50. The second portion 501A and the first portion 501A may not be side-etched, and the width difference of different metal layers may be directly used to reduce process difficulty to save time and effort. Furthermore, the side-etched third portion 501C may also effectively block the evaporation material, thereby more effectively preventing water and oxygen from invading the display region AA and improving the display effect.

Figure 19:
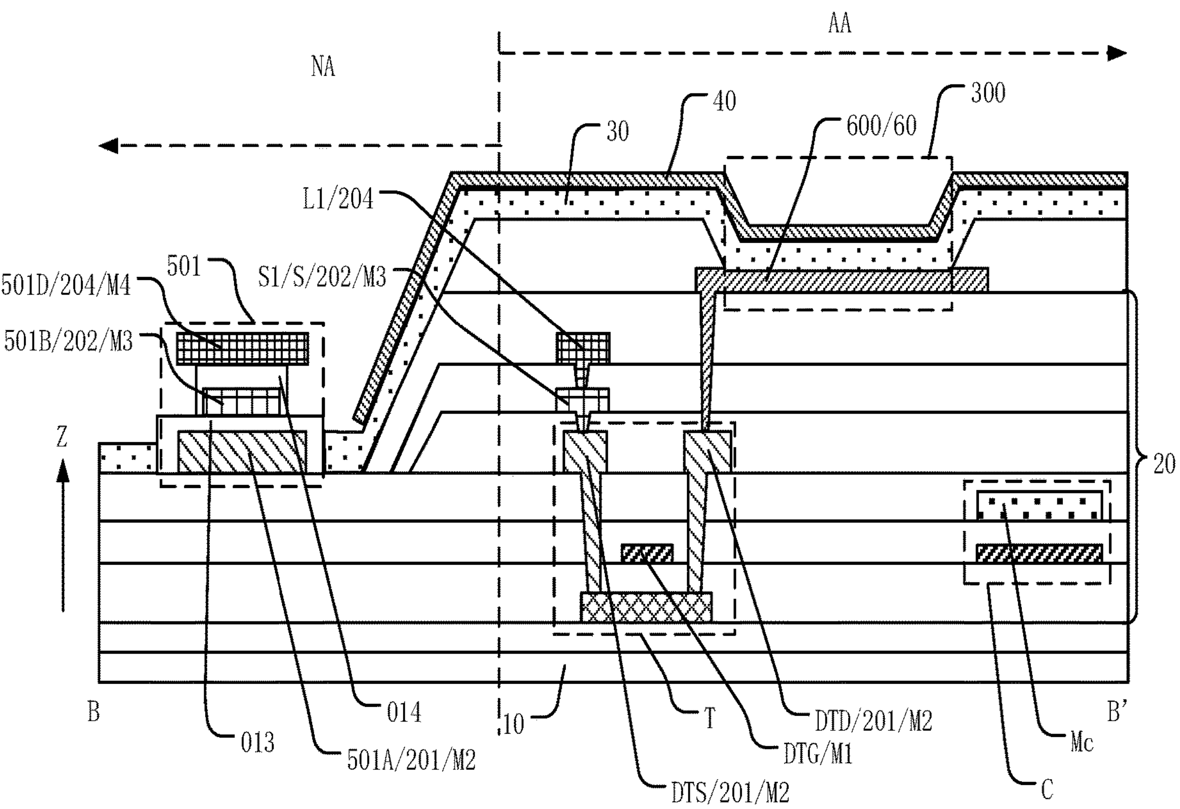
FIG. 19 illustrates another cross-sectional structural view along a B-B' direction in FIG. 7.

In some optional embodiments, referring to FIGS. 7 and 19, FIG. 19 illustrates another cross-sectional structural view along the B-B' direction in FIG. 7. In one embodiment, the drive circuit layer 20 may further include at least a fourth metal layer 204 which is on the side of the second metal layer 202 away from the substrate 10; the drive circuit layer 20 may include the plurality of drive transistors DT, the plurality of capacitors C, and the plurality of data lines S; the source electrode DTS and the drain electrode DTD of the drive transistor DT may be at the first metal layer 201; and the data lines S may be at the second metal layer 202.

Along the direction Z perpendicular to the plane of the display panel 000, the first isolation structure 501 may further include a fourth portion 501D on the side of the second portion 501B away from the first portion.

The fourth portion 501D may be at the fourth metal layer 204; the orthographic projection of the first portion 501A on the plane of the display panel 000 may cover the orthographic projection of the second portion 501B on the plane of the display panel 000; and the orthographic projection of the fourth portion 501D on the plane of the display panel 000 may cover the orthographic projection of the second portion 501B on the plane of the display panel 000.

The area of the orthographic projection of the second portion 501B on the plane of the display panel 000 may be less than the area of the orthographic projection of the first portion 501A on the plane of the display panel 000. The area of the orthographic projection of the second portion 501B on the plane of the display panel 000 may be less than the area of the orthographic projection of the fourth portion 501D on the plane of the display panel 000.

In one embodiment, it describes that the drive circuit layer 20 of the display panel 000 may include the plurality of metal layers. For example, when the drive circuit layer 20 uses the plurality of metal layers to form the drive transistor DT and capacitor C of the pixel circuit, the gate electrode DTG of the drive transistor DT may be at the gate metal layer M1, one electrode of the capacitor C may be at the capacitor metal layer Mc, the source electrode DTS and drain electrode DTD of the drive transistor DT may be at the first metal layer 201 which may be understood as the source and drain metal layer M2, the data line S may be at the second metal layer 202 which may be understood as the signal line metal layer M3, and the data line S may include the first data line S1. The drive circuit layer 20 of one embodiment may further include the fourth metal layer 204. The fourth metal layer 204 may be at the side of the second metal layer 202 away from the substrate 10. The fourth metal layer 204 may be understood as an additional metal layer of the display panel 000 disposed under the anode layer 60. Optionally, the display region AA of one embodiment may be configured with the first connection line L1. The first connection line L1 may be connected to the first data line S1 of the second metal layer 202. After the first connection line L1 extends gradually toward the first display region AA1 within the range of the display region AA1 and is connected to the fan-out wiring 80 of the fan-out region FA, the width of the fan-out region FA along the second direction X may be reduced, the lower frame of the display panel 000 may be further reduced, and the first connection line L1 may be disposed in the fourth metal layer 204 of the drive circuit layer 20. The fourth metal layer 204 may be understood as the connecting wire metal layer M4, which may prevent the first connection line L1 of the fourth metal layer 204 from interfering with signal wirings of other metal film layers to affect signal transmission.

In one embodiment, the first isolation structure 501 disposed in the non-display region NA may further include the fourth portion 501D. Along the direction Z perpendicular to the plane of the display panel 000, the fourth portion 501D of the first isolation structure 501 may be on the side of the second portion 501B of the first isolation structure 501 away from the first portion 501A of the first isolation structure 501. That is, the first isolation structure 501 may be the three metal layer stacked design of the first metal layer 201, the second metal layer 202, and the fourth metal layer 204 (the source and drain metal layer M2, the signal line metal layer M3, and the connection line metal layer M4). The first isolation structure 501 may be formed by the plurality of metal layers stacked with each other. Furthermore, the side etching process may not be applied on the side region of the first isolation structure 501; the fourth portion 501D of the upper layer and the first portion 501A of the lower layer may be configured to be wider; and the second portion 501B of the middle layer may be configured to be narrower. Furthermore, the side etching process may be avoided, and the manner of side etching a certain sub-layer in the single-layer metal may not be used, which may reduce process difficulty, save time and effort, and directly use width difference of different metal layers to effectively isolate evaporated material.

Optionally, referring to FIGS. 7 and 19, in one embodiment, the third insulating layer 013 may be disposed between the first metal layer 201 and the second metal layer 202; and the fourth insulating layer 014 may be disposed between the second metal layer 202 and the fourth metal layer 204. In such way, the first portion 501A and the second portion 501B may be separated and insulated by a part of the third insulating layer 013; and the second portion 501B and the fourth portion 501D may be separated and insulated by a part of the fourth insulating layer 014, which may be equivalent to raising the first isolation structure 501 to achieve a better isolation effect.

Figure 20:
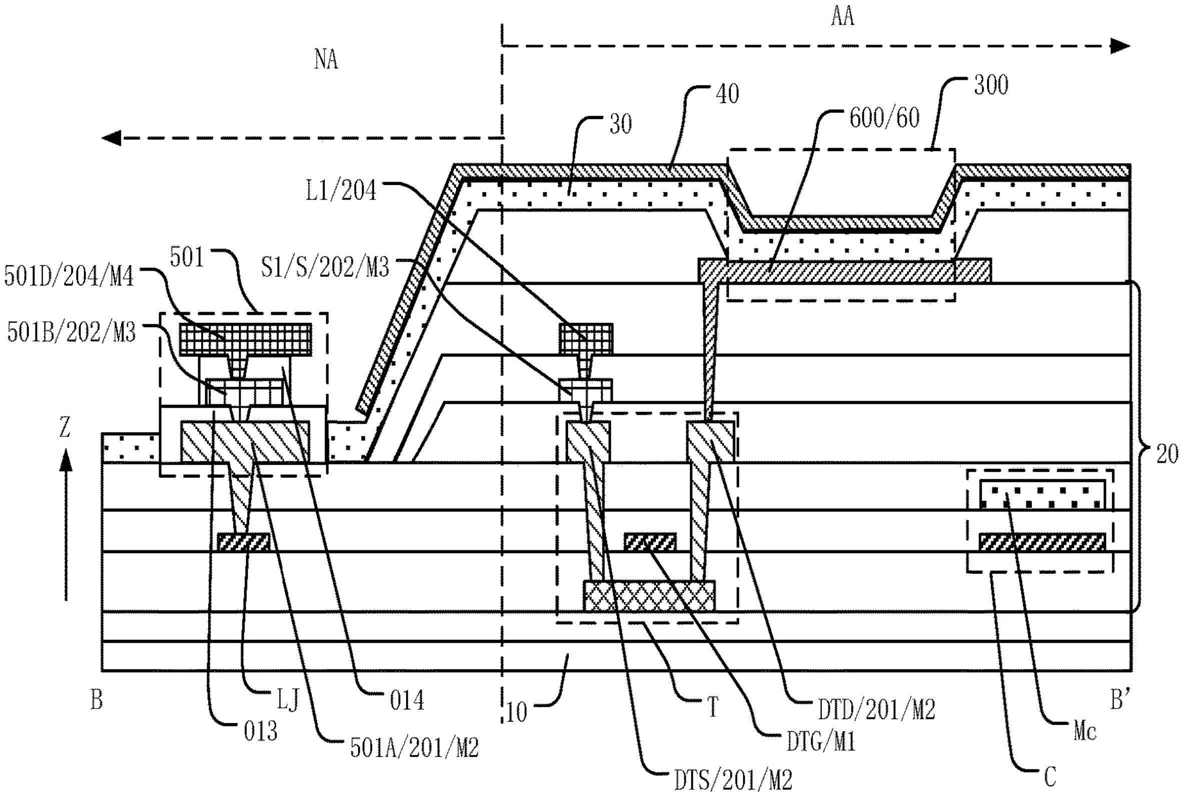
FIG. 20 illustrates another cross-sectional structural view along a B-B' direction in FIG. 7.

Optionally, referring to FIGS. 7 and 20, FIG. 20 illustrates another cross-sectional structural view along the B-B' direction in FIG. 7. In one embodiment, the first portion 501A may be in direct contact with the second portion 501B, and the fourth portion 501D may be in direct contact with the second portion 501B.

In one embodiment, it describes that the third insulating layer 013 may be disposed between the first metal layer 201 and the second metal layer 202; and the fourth insulating layer 014 may be disposed between the second metal layer 202 and the fourth metal layer 204. However, at the position of the first isolation structure 501, the fourth portion 501D, the second portion 501B, and the first portion 501A may be contacted, adjoined and connected with each other by forming hollow portions on the third insulating layer 013 and the fourth insulating layer 014. The first portion 501A on the first metal layer 201 may be adjoined with the ground wiring LJ of the lower layer to be connected with the ground signal during the use of the display panel 000. The second portion 501B in the second metal layer 202 may be electrically connected to the first portion 501A of the lower layer, which is equivalent to that the second portion 501B is also connected to the ground signal. The fourth portion 501D in the fourth metal layer 204 may be electrically connected to the first portion 501A of the lower layer, which is equivalent to that the fourth portion 501D is also connected to the ground signal. Therefore, static electricity in each film layer of the display panel 000 or entered static electricity when cutting the edge of the panel may be guided away in time, which may realize electrostatic protection effect on the display panel 000, thereby being beneficial for ensuring the display quality.

Figure 21:
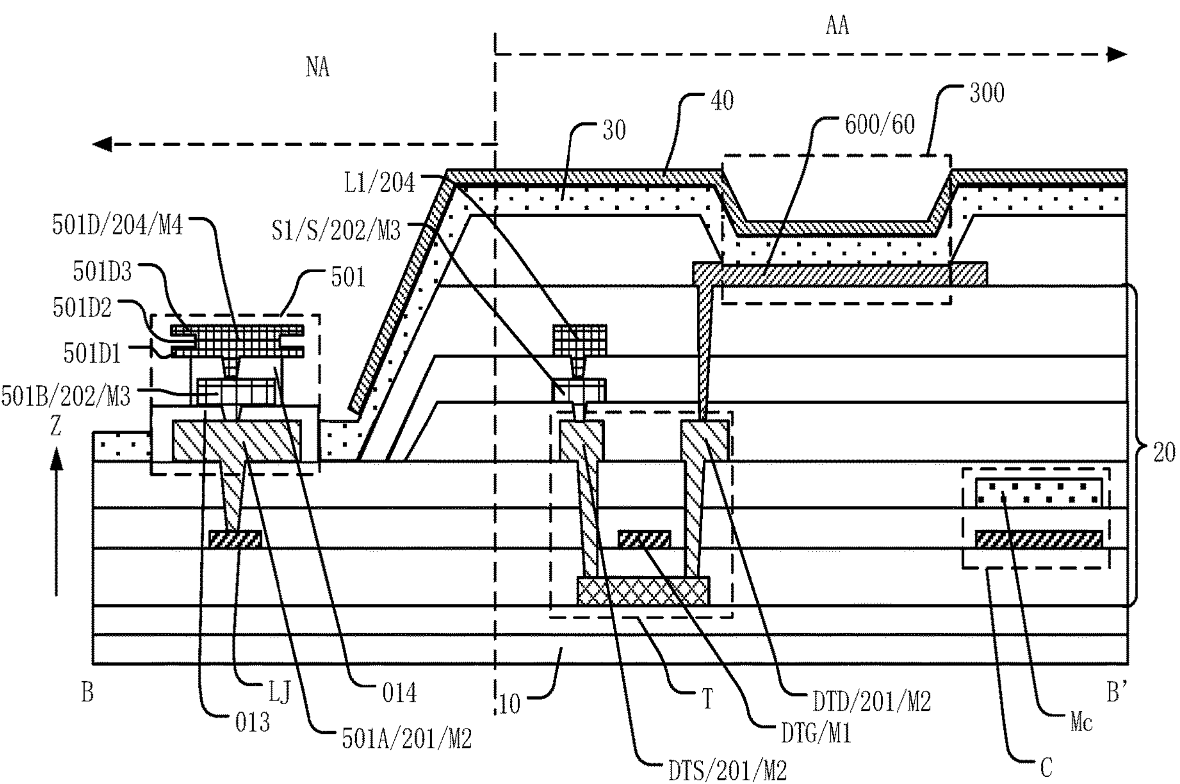
FIG. 21 illustrates another cross-sectional structural view along a B-B' direction in FIG. 7.

Optionally, referring to FIGS. 7 and 21, FIG. 21 illustrates another cross-sectional structural view along the B-B' direction in FIG. 7. Along the direction Z perpendicular to the plane of the display panel 000, the fourth portion 501D may include a seventh sub-portion 501D1, an eighth sub-portion 501D2, and a ninth sub-portion 501D3 which are configured to be stacked with each other; and the eighth sub-portion 501D2 may be between the seventh sub-portion 501D1 and the ninth sub-portion 501D3.

The orthographic projection of the seventh sub-portion 501D1 on the plane of the display panel 000 may cover the orthographic projection of the eighth sub-portion 501D2 on the plane of the display panel 000. The orthographic projection of the ninth sub-portion 501D3 on the plane of the display panel 000 may cover the orthographic projection of the eighth sub-portion 501D2 on the plane of the display panel 000.

The area of the orthographic projection of the eighth sub-portion 501D2 on the plane of the display panel 000 may be less than the area of the orthographic projection of the seventh sub-portion 501D1 on the plane of the display panel 000. The area of the orthographic projection of the eighth sub-portion 501D2 on the plane of the display panel 000 may be less than the area of the orthographic projection of the ninth sub-portion 501D3 on the plane of the display panel 000.

In one embodiment, it describes that in the structure of the first isolation structure 501 in the non-display region NA, the fourth portion 501D in the fourth metal layer 204 may be a structure that the plurality of sub-portions are stacked with each other. For example, along the direction Z perpendicular to the plane of the display panel 000, the fourth portion 501D may include the seventh sub-portion 501D1, the eighth sub-portion 501D2, and the ninth sub-portion 501D3 which are configured to be stacked with each other. The area of the eighth sub-portion 501D2 at the middle layer may be less than the area of each of the seventh sub-portion 501D1 at the lower layer and the ninth sub-portion 501D3 at the upper layer, such that the side-etched structure may be formed at the side surface of the fourth portion 501Df the first isolation structure 501 through narrower eighth sub-portion 501D2. The side-etched fourth portion 501D may be further stacked with the second portion 501B and the first portion 501A to form the first isolation structure 501, which may further effectively block the climbing of the light-emitting functional layer 50 and more effective prevent water and oxygen from intruding into the display region AA to affect the display effect.

Optionally, referring to FIGS. 7 and 21, the fourth metal layer 204 in one embodiment may be made of various metal materials. That is, when forming the fourth metal layer 204, the eighth sub-portion 501D2 may be made of a material different from the material the seventh sub-portion 501D1 and may be made of a material same as the material of the ninth sub-portion 501D3. For example, the formation material of the eighth sub-portion 501D2 may include an aluminum metal material, and the formation material of the seventh sub-portion 501D1 and the ninth sub-portion 501D3 may include a titanium metal material. The fourth metal layer 204 may be a film structure in which titanium, aluminum, and titanium are stacked with each other. In such way, it may not only reduce the impedance of the first connection line L1 made by the fourth metal layer 204 which is beneficial to signal transmission, but also reduce process difficulty of forming the seventh sub-portion 501D1, the eighth sub-portion 501D2, and the ninth sub-portion 501D3. When the fourth portion 501D of the first isolation structure 501 is formed and the fourth portion 501D is the structure that the side is partially recessed, the side etching process may not be needed. After wider seventh sub-portion 501D1 of the titanium metal material is formed, narrower eighth sub-portion 501D2 of the aluminum metal material may be formed, and finally, wider ninth sub-portion 501D3 of the titanium metal material may be completed. Furthermore, the passage of water and oxygen invading the display region AA may be effectively blocked, and the process efficiency of the second portion 501B may also be improved.

Figure 22:
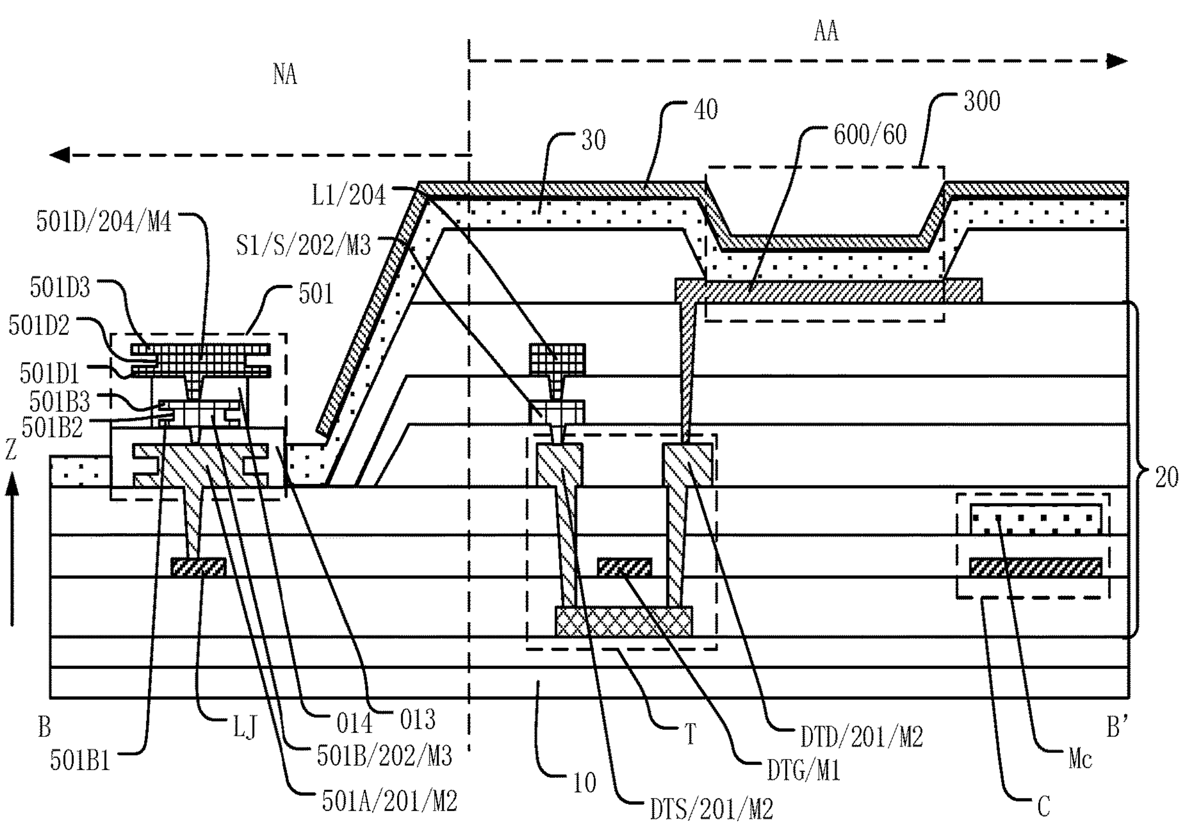
FIG. 22 illustrates another cross-sectional structural view along a B-B' direction in FIG. 7.

Optionally, referring to FIGS. 7 and 22, FIG. 22 illustrates another cross-sectional structural view along the B-B' direction in FIG. 7. In one embodiment, in the structure of the first isolation structure 501 in the non-display region NA, the fourth portion 501D in the fourth metal layer 204 may be a structure that a plurality of sub-portions are stacked with each other; the second portion 501B on the second metal layer 202 may be a structure that a plurality of sub-portions are stacked with each other; and the first portion 501A in the first metal layer 201 may be a structure that a plurality of sub-portions are stacked with each other. The first metal layer 201 may be the source and drain metal layer M2; and the material of the source-drain metal layer M2 itself may be a stacked metal layer of titanium, aluminum and titanium. The second metal layer 202 may be the signal line metal layer M3; and the signal line metal layer M3 may also be a metal layer stacked with titanium, aluminum and titanium. Therefore, each of the first portion 501A, the second portion 501B, and the fourth portion 501D of the first isolation structure 501 in one embodiment may be a structure with the side of being partially recessed. Furthermore, it may not only block the climbing of the organic light-emitting material on the first isolation structure 501 through the first portion 501A, the second portion 501B, and the fourth portion 501D with different widths, but also further improve the blocking effect through the first portion 501A of the side-etched structure, the second portion 501B of the side-etched structure, and the fourth portion 501D of the side-etched structure. While more effectively blocking the passage of water and oxygen invading the display region AA, the process efficiency of the second portion 501B may be desirably improved.

Optionally, referring to FIGS. 7 and 22, in the first isolation structure 501 of one embodiment, the area of the orthographic projection of the eighth sub-portion 501D2 of the fourth portion 501D on the plane of the display panel may be greater than the area of the orthographic projection of the second sub-portion 501B2 of the second portion 501B on the plane of the display panel 000.

In one embodiment, it describes that in the structure of the first isolation structure 501, the fourth portion 501D at the fourth metal layer 204 may be a structure that a plurality of sub-portions are stacked with each other, and the second portion 501B at the second metal layer 202 may be a structure that a plurality of sub-portions are stacked with each other. For example, along the direction Z perpendicular to the plane of the display panel 000, the second portion 501B may include the first sub-portion 501B1, the second sub-portion 501B2, and the third sub-portion 501B3 which are configured to be stacked with each other; and the area of the second sub-portion 501B2 at the middle layer may be less than the area of each of the first sub-portion 501B1 at the lower layer and the third sub-portion 501B3 at the upper layer. The fourth portion 501D at the fourth metal layer 204 may be a structure that a plurality of sub-portions are stacked with each other. For example, along the direction Z perpendicular to the plane of the display panel 000, the fourth portion 501D may include the seventh sub-portion 501D1, the eighth sub-portion 501D2, and the ninth sub-portion 501D3 which are configured to be stacked with each other; and the area of the eighth sub-portion 501D2 at the middle layer may be less than the area of each of the seventh sub-portion 501D1 at the lower layer and the ninth sub-portion 501D3 at the upper layer. The fourth portion 501D is wider than the second portion 501B, such that the area of the orthographic projection of the eighth sub-portion 501D2 of the fourth portion 501D on the plane of the display panel may be configured to be greater than the area of the orthographic projection of the second sub-portion 501B2 of the second portion 501B on the plane of the display panel 000. Furthermore, the side-etched structure may be formed at the side surface of the fourth portion 501D of the first isolation structure 501 through narrower eighth sub-portion 501D2. The side-etched fourth portion 501D may be further stacked with the side-etched second portion 501B and the side-etched first portion 501A to form the first isolation structure 501, which may further effectively block the climbing of the light-emitting functional layer 50, thereby more effectively preventing water and oxygen from intruding into the display region AA and affecting the display effect.

Figure 23:
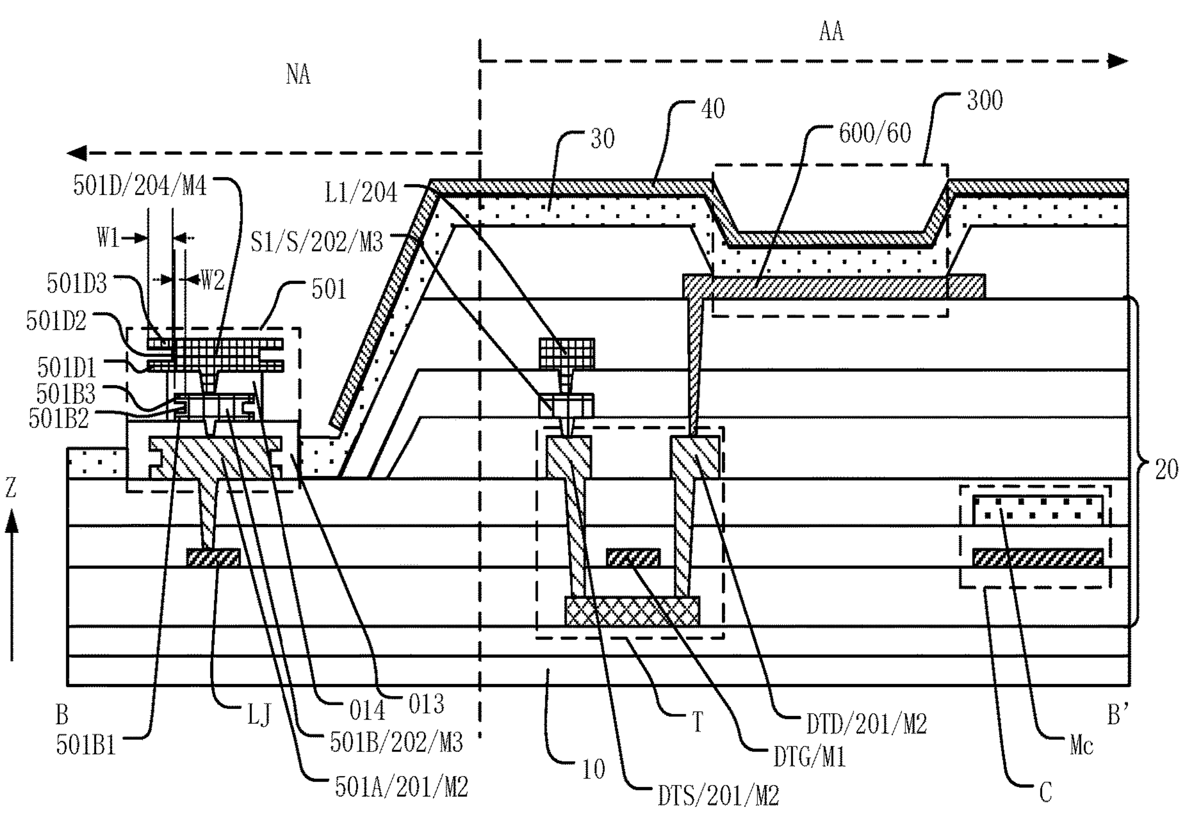
FIG. 23 illustrates another cross-sectional structural view along a B-B' direction in FIG. 7.

Optionally, referring to FIGS. 7 and 23, FIG. 23 illustrates another cross-sectional structural view along the B-B' direction in FIG. 7. In one embodiment, when the side surface of the fourth portion 501D of the first isolation structure 501 forms the side-etched structure through narrower eighth sub-portion 501D2, and the side surface of the second portion 501B forms the side-etched structure through narrower second sub-portion 501B2, the side-etched depth of the fourth portion 501D on the top of the first isolation structure 501 may be deeper. That is, the distance W1 between the boundary of the eighth sub-portion 501D2 and the boundary of the seventh sub-portion 501D1 may be greater than the distance W2 between the boundary of the second sub-portion 501B2 and the boundary of the first sub-portion 501B1. In one embodiment, it describes that differential designs may be performed for the side etching amount of the fourth portion 501D, the side etching amount of the second portion 501B, and the side etching amount of the first portion 501A in different metal layers. For example, the side etching amount of the first portion 501A and the side etching amount of the second portion 501B may be moderately reduced. Therefore, the resistance of the first portion 501A in the first metal layer 201 and the second portion 501B in the second metal layer 202 may be reduced, thereby reducing power consumption, and the side etching time and cost. The depth of the side engraving of the fourth portion 501D located on the top of the first isolation structure 501 may be deeper. That is, the distance W1 between the boundary of the eighth sub-portion 501D2 and the boundary of the seventh sub-portion 501D1 may be greater than the distance W2 between the boundary of the second sub-portion 501B2 and the boundary of the first sub-portion 501B1, which may desirably ensure the isolation effect of the first isolation structure 501 on the organic light-emitting material to improve the display quality.

Figure 24:
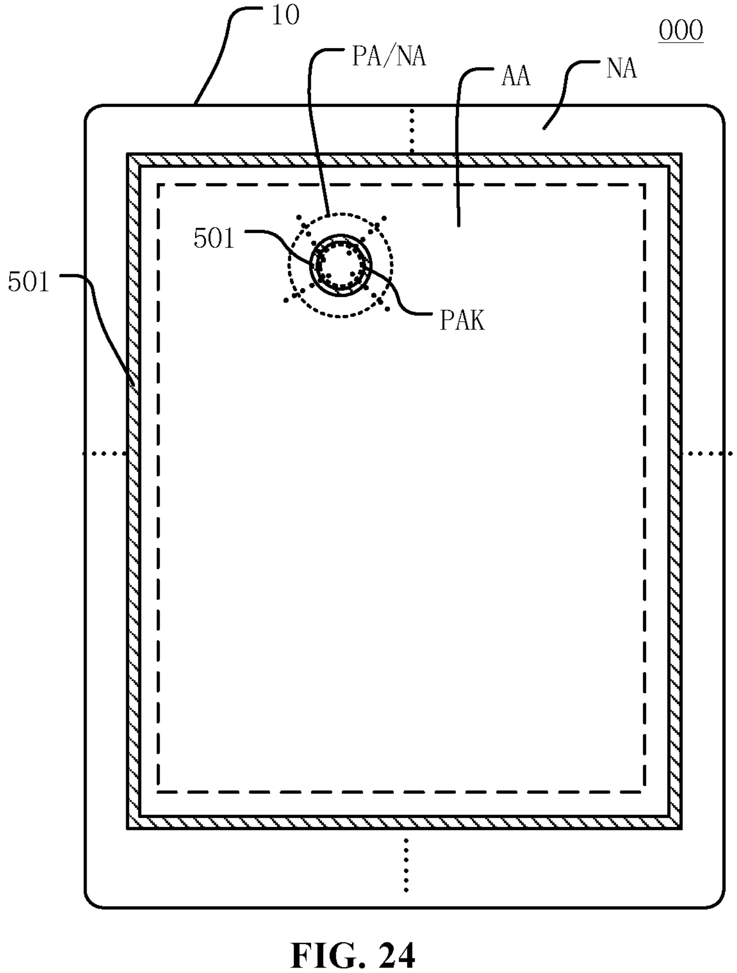
FIG. 24 illustrates another planar structural schematic of a display panel according to various embodiments of the present disclosure.

In some optional embodiments, referring to FIG. 24, FIG. 24 illustrates another planar structural schematic of the display panel according to various embodiments of the present disclosure. In one embodiment, the display panel 000 may include a functional device region PA, and the display region AA may be at least partially arranged to be around the functional device region PA.

The first isolation structure 501 may be in the functional device region PA.

Optionally, the first isolation structure 501 in the functional device region PA may be understood with reference to the structures in above embodiments, which may not be described in one embodiment herein.

In order to increase the screen-to-body ratio of the display panel in one embodiment, an opening may be formed on the display panel, and optical devices such as a front camera and an optical sensor may be arranged in the functional device region corresponding to the opening of the screen. However, in the existing technology, for the formation of the display panel with the opening in the display region, after the formation of each functional layer of the display panel (the drive circuit layer, the light-emitting functional layer, the encapsulation layer and the like) is completed, reserved region within the original display range of the display panel may be cut to form a through hole. For example, when evaporating the light-emitting functional layer of the display panel, since the light-emitting functional layer includes an organic light-emitting material, the original display region of the display panel may be fully evaporated when the organic light-emitting material is evaporated; and reserved region within the original display range of the display panel may be cut to form the through hole. Therefore, after the through hole is formed in the functional device region, the light-emitting functional layer may be exposed on the side wall of the through hole. The organic light-emitting material of the light-emitting functional layer is sensitive to water and oxygen, and the light-emitting functional layer exposed on the side wall may form a passage for water and oxygen to invade. When water and oxygen enter the sub-pixel region in the display region, the performance of the light-emitting functional layer may be invalidated, and normal display may not be performed, which may result in black spots on the pixel display and affect the performance and reliability of the display panel.

In order to solve above problems, the first isolation structure 501 disposed in the functional device region PA is provided in the display panel 000 of the one embodiment. Optionally, the first isolation structure 501 may be disposed on the periphery of the functional device region PA to around the through hole PAK formed in the functional device region PA. The first isolation structure 501 in the functional device region PA may be understood with reference to the structures in above embodiments, which may not be described in one embodiment herein. The light-emitting functional layer 30 or other film layers extending to the functional device region PA may be isolated using the first isolation structure 501 in above embodiments, thereby blocking the passage of water and oxygen intruding into the display region AA after the through hole is formed in the functional device region PA and improving performance reliability of the display panel 000.

It may be understood that the shape of the functional device region PA may not be limited in one embodiment. The shape of the orthographic projection of the functional device region PA on the plane of the display panel 000 may only be a circle, which may be taken as an example for illustration. In one embodiment, the position of the functional device region PA in the display panel 000 may not be limited and may be selected according to actual requirement during an implementation.

In some optional embodiments, referring to FIGS. 1 and 2, along the direction from the display region AA to the non-display region NA, the non-display region NA may include a first region NA1 adjacent to the display region AA, and the first isolation structure 501 may be in the first region NA1.

In one embodiment, it describes that the first isolation structure 501 for isolating at least one of the light-emitting functional layer 30, the first electrode layer 40, and other corresponding film layers extending to the non-display region NA may be disposed in the non-display region NA closest to the display region AA NA1. The first region NA1 may be understood as the region closest to the display region AA in the non-display region NA. The first isolation structure 501 may be disposed in the first region NA1 and may isolate at least one of the light-emitting functional layer 30, the first electrode layer 40, and other corresponding film layers extending to the non-display region NA at the position closest to the display region AA, thereby blocking the invasion of water and oxygen to adjacent display region AA. The first isolation structure 501 disposed in the first region NA1 may be configured as the closest line of defense outside the display region AA, which may effectively prevent the light-emitting portion 300 of the display region AA from being affected by water and oxygen to cause luminescence failure and ensure the display quality.

Figure 25:
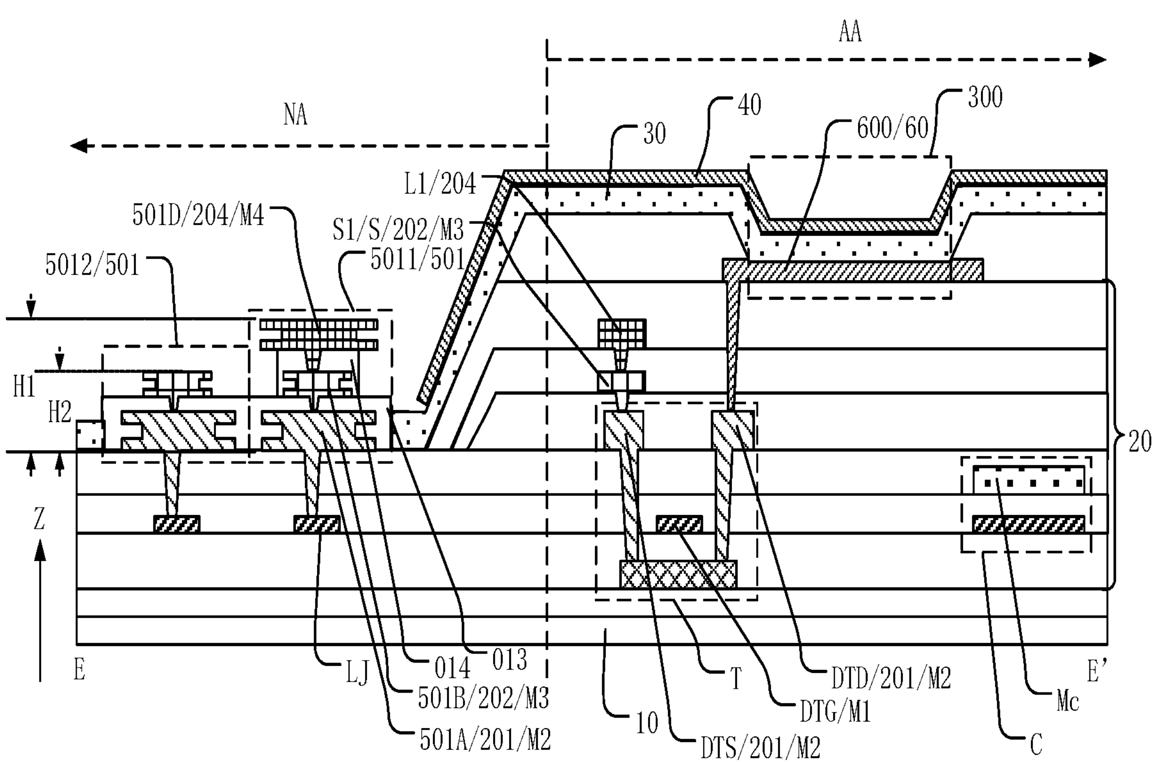
FIG. 25 illustrates another cross-sectional structural view along an E-E' direction in FIG. 14.
Figure 26:
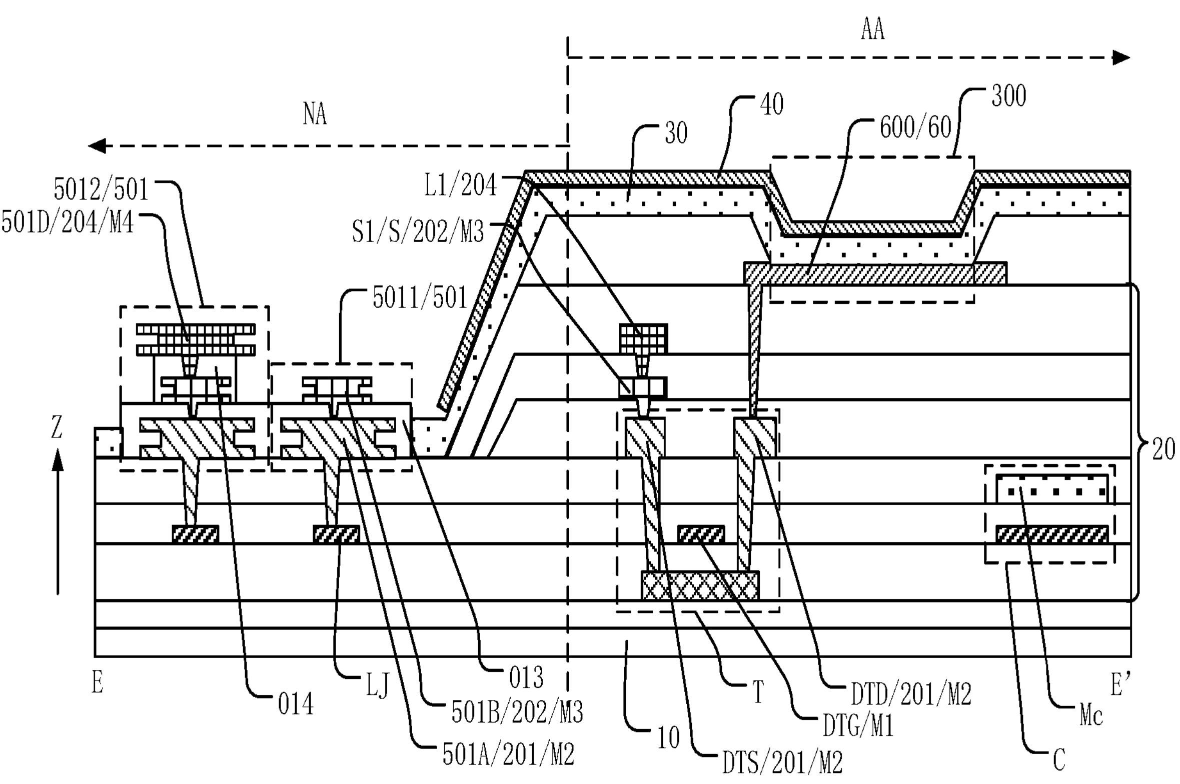
FIG. 26 illustrates another cross-sectional structural view along an E-E' direction in FIG. 14.

In some optional embodiments, referring to FIGS. 14, 25 and 26, FIG. 25 illustrates another cross-sectional structural view along the E-E' direction in FIG. 14; and FIG. 26 illustrates another cross-sectional structural view along the E-E' direction in FIG. 14. In one embodiment, the plurality of first isolation structures 501 may at least include first sub-isolation structures 5011 and second sub-isolation structures 5012 arranged along the direction from the display region AA to the non-display region NA; and along the direction Z perpendicular to the plane of the display panel 000, the heights of the first sub-isolation structure 5011 and the second sub-isolation structure 501 may be different.

In one embodiment, it describes that the plurality of first isolation structures 501 in the non-display region NA may be set to have different heights by the structures of different numbers of stacked metal layers. For example, the plurality of first isolation structures 501 in the non-display region NA may be set to have different heights by the structures of different numbers of stacked metal layers; and along the direction Z perpendicular to the plane of the display panel 000, the heights of the first sub-isolation structure 5011 and the second sub-isolation structure 501 may be different. As shown in FIG. 25, the first sub-isolation structure 5011 may be a three metal layer stacked structure (such as the first metal layer 201, the second metal layer 202, and the fourth metal layer 204), and the second sub-isolation structure 5012 may be two metal layer stacked structure (such as the first metal layer 201 and the second metal layer 202); or as shown in FIG. 26, the first sub-isolation structure 5011 may be a three metal layer stacked structure (such as the first metal layer 201, the second metal layer 202, and the fourth metal layer 204), and the second sub-isolation structure 5012 may be a two metal layer stacked structure (such as the second metal layer 202 and the fourth metal layer 204); or the second sub-isolation structure 5012 may be a three metal layer stacked structure (such as the first metal layer 201, the second metal layer 202, and the fourth metal layer 204), and the first sub-isolation structure 5011 may be a two metal layer stacked structure (such as the first metal layer 201 and the second metal layer 202); or the second sub-isolation structure 5012 may be a three metal layer stacked structure (such as the first metal layer 201, the second metal layer 202, and the fourth metal layer 204), and the first sub-isolation structure 5011 may be a two metal layer stacked structure (such as the second metal layer 202 and the fourth metal layer 204), which may not be shown in the drawings. In one embodiment, the plurality of first isolation structures 501 in the non-display region NA may be formed by different stacking numbers of metal layers, so that the heights of the first isolation structures 501 at different positions may be different. During the process of evaporating the organic light-emitting material, uneven climbing slopes may be formed on the plurality of first isolation structures 501 with different heights, which may be beneficial for further improving the isolation effect of evaporated material on water and oxygen.

Optionally, referring to FIGS. 14 and 25, in one embodiment, along the direction from the display region AA to the non-display region NA, the first sub-isolation structure 5011 may be on the side of the second sub-isolation structure 5012 adjacent to the display region AA; and along the direction Z perpendicular to the plane of the display panel 000, the height H1 of the first sub-isolation structure 5011 may be greater than the height H2 of the second sub-isolation structure 5012.

In one embodiment, it describes that when the plurality of first isolation structures 501 arranged side by side are arranged in the non-display region NA, the first sub-isolation structure 5011 may be closer to the display region AA than the second sub-isolation structure 5012; and the stacking height of the first sub-isolation structure 5011 closer to the display region AA may be higher. That is, the height of the first sub-isolation structure 5011 closest to the display region AA may be made higher by increasing the number of stacked metal layers. The blocking effect may be improved by using the first sub-isolation structure 5011 with a higher height, thereby ensuring the display quality of the display region AA.

Figure 27:
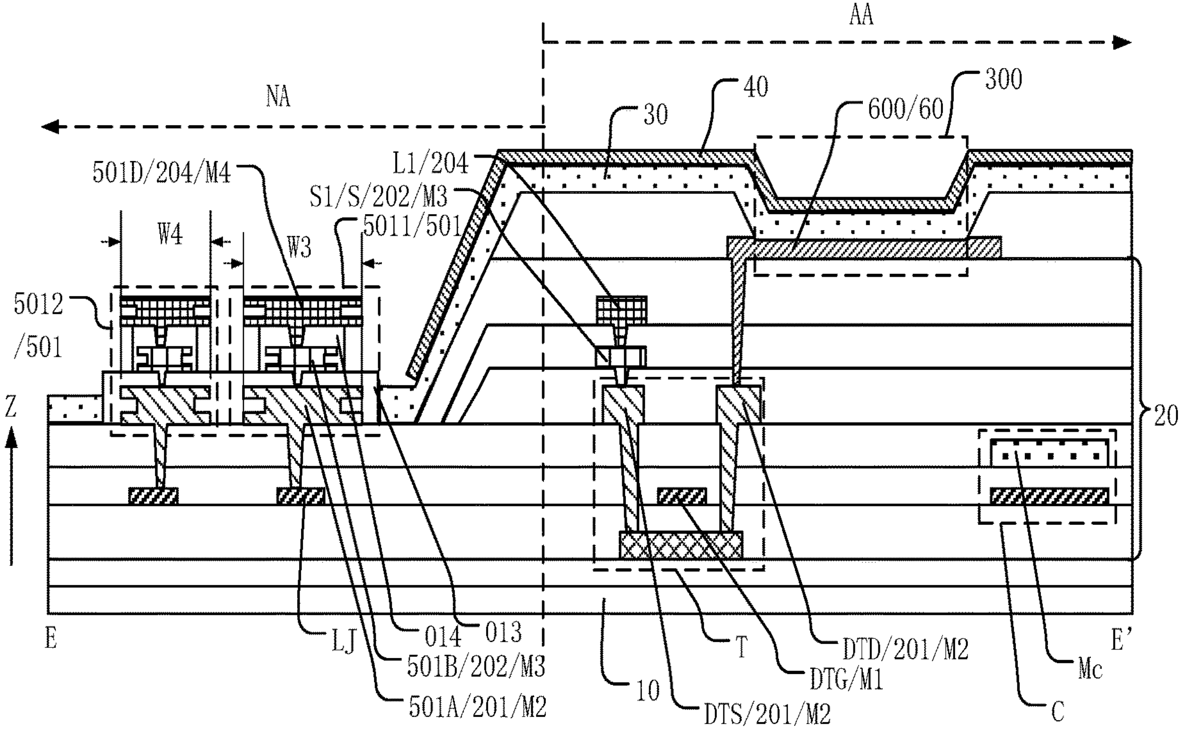
FIG. 27 illustrates another cross-sectional structural view along an E-E' direction in FIG. 14.

Optionally, referring to FIGS. 14 and 27, FIG. 27 illustrates another cross-sectional structural view along the E-E' direction in FIG. 14. The area of the orthographic projection of the first sub-isolation structure 5011 on the plane of the display panel 000 may be greater than the area of the orthographic projection of the second sub-isolation structure 5012 on the plane of the display panel 000.

In one embodiment, it describes that when the plurality of first isolation structures 501 arranged side by side are arranged in the non-display region NA, the first sub-isolation structure 5011 may be closer to the display region AA than the second sub-isolation structure 5012; and the orthographic projection area of the first sub-isolation structure 5011 closer to the display region AA on the plane of the display panel 000 may be larger, which is embodied in FIG. 27 that the width W3 of the orthographic projection of the first sub-isolation structure 5011 on the plane of the display panel 000 may be wider than the width W4 of the orthographic projection of the second sub-isolation structure 5012 on the plane of the display panel 000. In such way, the blocking effect may be improved by increasing the width of the first sub-isolation structure 5011 closest to the display region AA to ensure the display quality of the display region AA.

It may be understood that, in one embodiment, the orthographic projection area of the first sub-isolation structure 5011 closer to the display region AA on the plane of the display panel 000 may be larger, which is embodied in FIG. 27 that the width W3 of the orthographic projection of the first sub-isolation structure 5011 on the plane of the display panel 000 may be wider. The width W3 of the orthographic projection of the first sub-isolation structure 5011 on the plane of the display panel 000 may be understood as the width of the orthographic projection of the widest first portion 501 of the first sub-isolation structure 5011 on the plane of the display panel 000. In such way, the effect of increasing the width of entire first sub-isolation structure 5011 may be realized.

Figure 28:
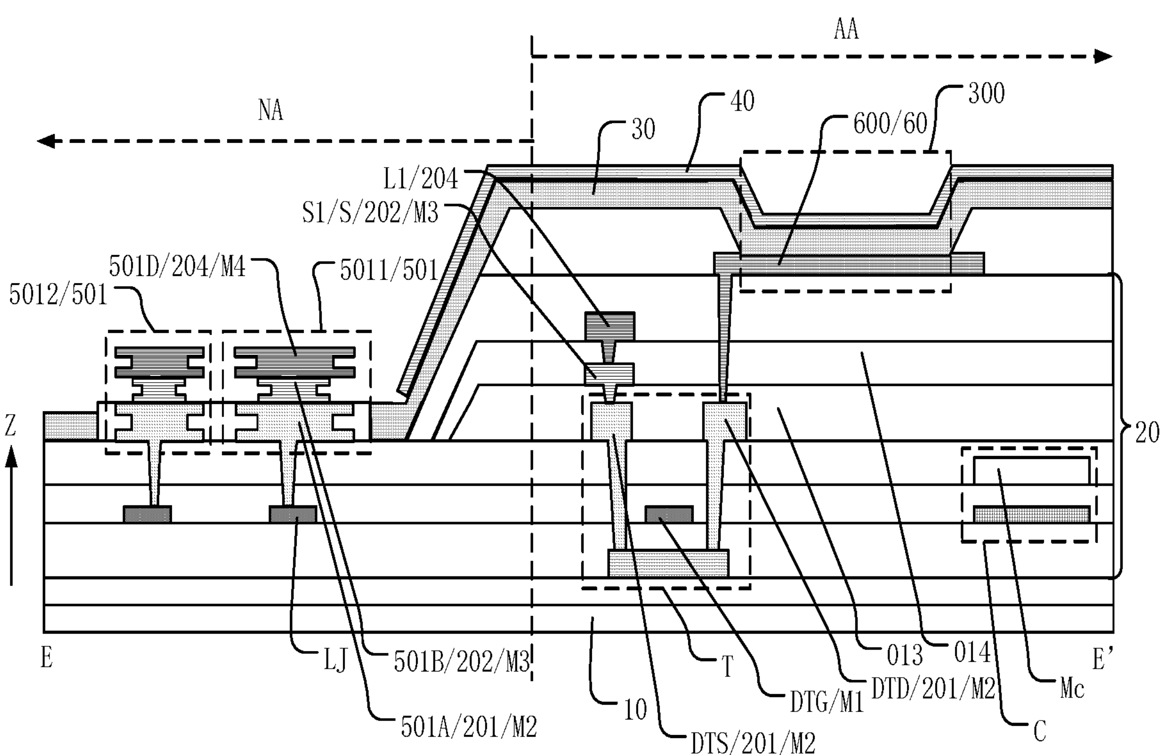
FIG. 28 illustrates another cross-sectional structural view along an E-E' direction in FIG. 14.

In some optional embodiments, referring to FIGS. 14 and 28, FIG. 28 illustrates another cross-sectional structural view along the E-E' direction in FIG. 14. In one embodiment, the first isolation structure 501 in the non-display region NA of the display panel 000 may use the structure that the plurality of metal layers are directly stacked with each other. For example, the first isolation structure 501 may include the first portion 501A in the first metal layer 201, the second portion 501B in the second metal layer 202, and the fourth portion 501D in the fourth metal layer 204. The first portion 501A, the second portion 501B, and the fourth portion 501D may be in direct contact. In the formation process of the first isolation structure 501, after the first portion 501A of the first metal layer 201 is formed, the third insulating layer 013 may be formed; the third insulating layer 013 above the first portion 501A may be completely etched away by exposure, development and etching processes, and then the second portion 501B of the second metal layer 202 may be formed; after the second portion 501B of the second metal layer 202 is formed, the fourth insulating layer 014 may be formed; and the fourth insulating layer 014 above the second portion 501B may be completely etched away by exposure, development and etching processes, and finally the fourth portion 501D of the fourth metal layer 204 may be formed. Through the exposure and development technology, the fourth portion 501D, the second portion 501B, and the first portion 501A may be directly contacted and adjoined with each other, and the hollow portion in the insulating layer may not need to be configured to realize the electrical connection, which may further be beneficial for simplifying process steps with higher degree of design freedom, and further improving process efficiency.

Figure 29:
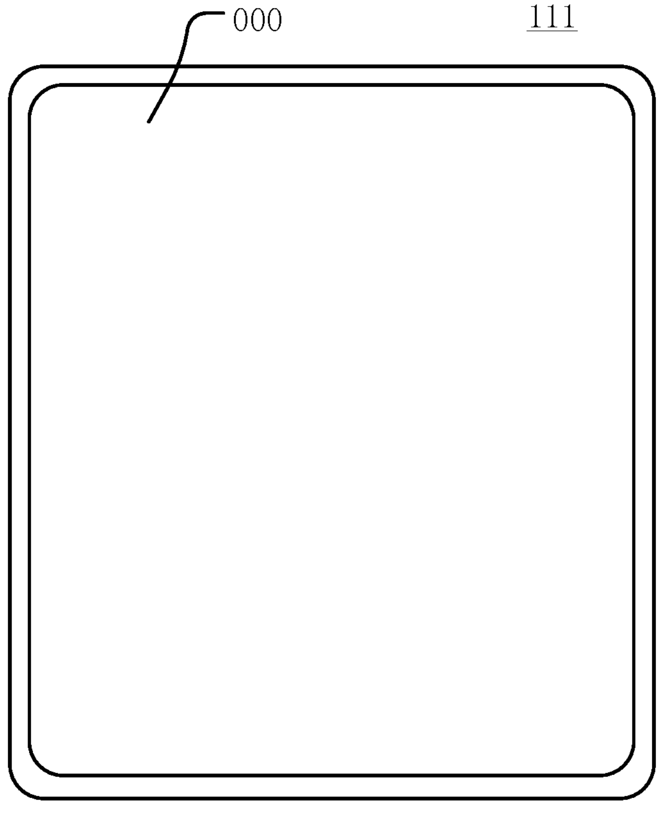
FIG. 29 illustrates a planar structural schematic of a display apparatus according to various embodiments of the present disclosure.

In some optional embodiments, referring to FIG. 29, FIG. 29 illustrates a planar structural schematic of a display apparatus according to various embodiments of the present disclosure. A display apparatus 111 provided in one embodiment may include the display panel 000 provided in above embodiments of the present disclosure. In one embodiment, a mobile phone may be taken as an example to illustrate the display apparatus 111 in FIG. 29. It may be understood that the display apparatus 111 provided in embodiments of the present disclosure may be a computer, a television, a vehicle-mounted display device and other display apparatuses with display function, which may not be limited in the present disclosure. The display apparatus 111 provided in embodiments of the present disclosure may have the beneficial effect of the display panel 000 provided in embodiments of the present disclosure, which may refer to the description of the display panel 000 in above-mentioned embodiments for details.

From above-mentioned embodiments, it may be seen that the display panel and the display apparatus provided by the present disclosure may achieve at least following beneficial effects.

The display panel of the present disclosure may include the substrate for carrying other film layers; the drive circuit layer may be on a side of the substrate; the drive circuit layer may at least include the first metal layer and the second metal layer; the second metal layer may be farther away from the substrate than the first metal layer; the drive circuit layer may be configured to form drive devices, drive circuits and the like; the light-emitting functional layer and the first electrode layer may be arranged on the side of the drive circuit layer away from the substrate; and the first electrode layer may be the cathode of entire surface structure. Within the range of the non-display region of the display panel, the plurality of first isolation structures may be on a side of the substrate; and at least one first isolation structure may isolate at least one of the light-emitting functional layer, the first electrode layer, and other corresponding film layers extending to the non-display region. Furthermore, at least one first isolation structure may be configured to include the first portion and the second portion respectively in two metal layers in the present disclosure. The first isolation structure of at least two stacked metal layers may not only make the formation process of the first portion of the first metal layer not be affected by the formation process of the metal wiring of the first metal layer in the display region; but also make the formation processes of the second portion and the metal wiring in the display region co-located in the second metal layer unaffected by each other. In addition, the height of the first isolation structure may be increased by the first portion and the second portion with two layer stacked configuration; and the first portion and the second portion may be separated by partial insulating layer, which may effectively isolate evaporated organic light-emitting material when climbing on the first isolation structure. Compared with the side-etched isolation columns formed using single-layer metal in the existing technology, not only the formation process of the first and second portions may be simplified to reduce the process difficulty; but also, the first isolation structure of the present disclosure may have desirable isolation effect. The first isolation structure may effectively avoid the phenomenon that the light-emitting portion of the display region is affected by water and oxygen and fails to emit light, thereby desirably ensuring the display quality of the display panel.

Although some embodiments of the present disclosure have been described in detail through various embodiments, those skilled in the art should understand that above embodiments may be for illustration only and may not be intended to limit the scope of the present disclosure. Those skilled in the art should understood that modifications may be made to above embodiments without departing from the scope and spirit of the present disclosure. The scope of the present disclosure may be defined by the appended claims.

What is claimed is:

1. A display panel, including a display region and a non-display region adjacent to the display region, comprising:

a substrate;

a drive circuit layer, at least including a first metal layer and a second metal layer, wherein the second metal layer is on a side of the first metal layer away from the substrate;

a light-emitting functional layer, on a side of the drive circuit layer away from the substrate, wherein the light-emitting functional layer includes a plurality of light-emitting portions; and a first electrode layer, on a side of the light-emitting functional layer away from the substrate, wherein:

a plurality of first isolation structures is on a side of the substrate and in the non-display region; and at least one first isolation structure isolates at least one of the light-emitting functional layer, the first electrode layer, and other corresponding film layers extending to the non-display region;

along a direction perpendicular to a plane of the display panel, the at least one first isolation structure includes a first portion and a second portion which are configured to be stacked with each other; the first portion is at the first metal layer; the second portion is at the second metal layer; and the first metal layer and the second metal layer are separated by an insulating layer; and an orthographic projection of the first portion on the plane of the display panel covers an orthographic projection of the second portion on the plane of the display panel such that the first portion, the second portion, and the insulating layer together form the first isolation structure with a tapered structure.

2. The display panel according to claim 1, wherein:

the insulating layer includes a plurality of hollow portions; an orthographic projection of a hollow portion on the plane of the display panel is within a range of the orthographic projection of the first portion on the plane of the display panel; and at least a part of the second portion is filled in the hollow portion to be in direct contact with the first portion.

3. The display panel according to claim 1, wherein:

along the direction perpendicular to the plane of the display panel, the second portion includes a first sub-portion, a second sub-portion, and a third sub-portion which are configured to be stacked with each other; and the second sub-portion is between the first sub-portion and the third sub-portion;

an orthographic projection of the first sub-portion on the plane of the display panel covers an orthographic projection of the second sub-portion on the plane of the display panel; and an orthographic projection of the third sub-portion on the plane of the display panel covers the orthographic projection of the second sub-portion on the plane of the display panel; and an area of the orthographic projection of the second sub-portion on the plane of the display panel is less than an area of the orthographic projection of the first sub-portion on the plane of the display panel and also less than an area of the orthographic projection of the third sub-portion on the plane of the display panel.

4. The display panel according to claim 3, wherein:

the drive circuit layer includes a plurality of metal layers; along the direction perpendicular to the plane of the display panel, a distance from the second metal layer to the light-emitting functional layer is less than a distance from another metal layer of the drive circuit layer to the light-emitting functional layer.

5. The display panel according to claim 3, wherein:

a material of the second sub-portion is different from a material of the first sub-portion; and the material of the first sub-portion is same as a material of the third sub-portion.

6. The display panel according to claim 5, wherein:

the second sub-portion is made of an aluminum metal material; and the first sub-portion and the third sub-portion are made of a titanium metal material.

7. The display panel according to claim 3, wherein:

the plurality of first isolation structures includes a first sub-isolation structure and a second sub-isolation structure; and along a direction from the display region to the non-display region, the first sub-isolation structure is on a side of the second sub-isolation structure adjacent to the display region; and an area of an orthographic projection of a second sub-portion of the first sub-isolation structure on the plane of the display panel is less than an area of an orthographic projection of a second sub-portion of the second sub-isolation structure on the plane of the display panel.

8. The display panel according to claim 1, wherein:

the drive circuit layer at least further includes a third metal layer, wherein the third metal layer is on a side of the second metal layer away from the substrate; and the drive circuit layer includes a plurality of drive transistors and a plurality of capacitors, wherein a gate electrode of a drive transistor of the plurality of drive transistors is at the first metal layer, an electrode of a capacitor of the plurality of capacitors is at the second metal layer, and a source electrode and a drain electrode of the drive transistor are at the third metal layer;

along the direction perpendicular to the plane of the display panel, the first isolation structure further includes a third portion on a side of the second portion away from the first portion;

the third portion is at the third metal layer;

an orthographic projection of the third portion on the plane of the display panel covers the orthographic projection of the second portion on the plane of the display panel; and an area of the orthographic projection of the second portion on the plane of the display panel is less than an area of the orthographic projection of the first portion on the plane of the display panel and less than an area of the orthographic projection of the third portion on the plane of the display panel.

9. The display panel according to claim 8, wherein:

along the direction perpendicular to the plane of the display panel, the third portion includes a fourth sub-portion, a fifth sub-portion, and a sixth sub-portion which are configured to be stacked with each other; and the fifth sub-portion is between the fourth sub-portion and the sixth sub-portion;

an orthographic projection of the fourth sub-portion on the plane of the display panel covers an orthographic projection of the fifth sub-portion on the plane of the display panel; and an orthographic projection of the sixth sub-portion on the plane of the display panel covers the orthographic projection of the fifth sub-portion on the plane of the display panel; and an area of the orthographic projection of the fifth sub-portion on the plane of the display panel is less than an area of the orthographic projection of the fourth sub-portion on the plane of the display panel and less than an area of the orthographic projection of the sixth sub-portion on the plane of the display panel.

10. The display panel according to claim 3, wherein:

the drive circuit layer at least further includes a fourth metal layer, wherein the fourth metal layer is on a side of the second metal layer away from the substrate; the drive circuit layer includes a plurality of drive transistors, a plurality of capacitors, and a plurality of data lines; a source electrode and a drain electrode of the drive transistor are at the first metal layer; and the plurality of data lines is at the second metal layer;

along the direction perpendicular to the plane of the display panel, the first isolation structure further includes a fourth portion on a side of the second portion away from the first portion;

the fourth portion is at the fourth metal layer; and an orthographic projection of the fourth portion on the plane of the display panel covers the orthographic projection of the second portion on the plane of the display panel; and an area of the orthographic projection of the second portion on the plane of the display panel is less than an area of the orthographic projection of the first portion on the plane of the display panel and less than an area of the orthographic projection of the fourth portion on the plane of the display panel.

11. The display panel according to claim 10, wherein:

along the direction perpendicular to the plane of the display panel, the fourth portion includes a seventh sub-portion, an eighth sub-portion, and a ninth sub-portion which are configured to be stacked with each other; and the eighth sub-portion is between the seventh sub-portion and the ninth sub-portion;

an orthographic projection of the seventh sub-portion on the plane of the display panel covers an orthographic projection of the eighth sub-portion on the plane of the display panel; and an orthographic projection of the ninth sub-portion on the plane of the display panel covers the orthographic projection of the eighth sub-portion on the plane of the display panel;

an area of the orthographic projection of the eighth sub-portion on the plane of the display panel is less than an area of the orthographic projection of the seventh sub-portion on the plane of the display panel, and less than an area of the orthographic projection of the ninth sub-portion on the plane of the display panel; and/or the area of the orthographic projection of the eighth sub-portion on the plane of the display panel is greater than the area of the orthographic projection of the second sub-portion on the plane of the display panel.

12. The display panel according to claim 10, wherein:

the first portion is in direct contact with the second portion; and the fourth portion is in direct contact with the second portion.

13. The display panel according to claim 1, further including:

a functional device region, wherein the display region is at least partially arranged to be around the functional device region; and the plurality of first isolation structures is in the functional device region.

14. The display panel according to claim 1, wherein:

along a direction from the display region to the non-display region, the non-display region includes a first region adjacent to the display region; and the plurality of first isolation structures is in the first region; and/or the plurality of first isolation structures at least includes a first sub-isolation structure and a second sub-isolation structure which are arranged along a direction from the display region to the non-display region; and along the direction perpendicular to the plane of the display panel, heights of the first sub-isolation structure and the second sub-isolation structure are different.

15. The display panel according to claim 14, wherein:

along the direction from the display region to the non-display region, the first sub-isolation structure is on a side of the second sub-isolation structure adjacent to the display region; and along the direction perpendicular to the plane of the display panel, a height of the first sub-isolation structure is greater than a height of the second sub-isolation structure; and/or an area of an orthographic projection of the first sub-isolation structure on the plane of the display panel is greater than an area of an orthographic projection of the second sub-isolation structure on the plane of the display panel.

16. A display panel, including a display region and a non-display region adjacent to the display region, comprising:

a substrate;

a drive circuit layer, at least including a first metal layer and a second metal layer, wherein the second metal layer is on a side of the first metal layer away from the substrate;

a light-emitting functional layer, on a side of the drive circuit layer away from the substrate, wherein the light-emitting functional layer includes a plurality of light-emitting portions; and a first electrode layer, on a side of the light-emitting functional layer away from the substrate, wherein:

a plurality of first isolation structures is on a side of the substrate and in the non-display region; and at least one first isolation structure isolates at least one of the light-emitting functional layer, the first electrode layer, and other corresponding film layers extending to the non-display region;

along a direction perpendicular to a plane of the display panel, the at least one first isolation structure includes a first portion and a second portion which are configured to be stacked with each other; the first portion is at the first metal layer; the second portion is at the second metal layer; and the first metal layer and the second metal layer are separated by an insulating layer;

the display region includes a plurality of first data lines extending along a first direction;

the non-display region includes a binding region on a side of the display region;

the binding region includes a plurality of conductive soldering pads; and the plurality of conductive soldering pads is electrically connected to a plurality of fan-out wirings which is in the non-display region; and a first data line of the plurality of first data lines is connected to a fan-out wiring of the plurality of fan-out wirings through at least one first connection line; and the at least one first connection line is in the display region and at the second metal layer.

17. The display panel according to claim 16, wherein:

an anode layer is between the second metal layer and the light-emitting functional layer; the anode layer includes a plurality of anodes; and at least one anode corresponds to one light-emitting portion;

the second metal layer includes a plurality of second isolation structures in the display region; and a second isolation structure is between two adjacent anodes; a plurality of openings is formed at the second isolation structure; at least a part of a light-emitting portion and a part of an anode are in an opening of the plurality of openings; the light-emitting portion covers the anode; and the anode and the second isolation structure are insulated by the light-emitting portion.

18. The display panel according to claim 17, wherein:

an orthographic projection of a first connection line on the plane of the display panel is at least not partially overlapped with an orthographic projection of the light-emitting portion on the plane of the display panel; and a part of the first connection line is multiplexed as the second isolation structure.

19. The display panel according to claim 17, wherein:

along the direction perpendicular to the plane of the display panel, the second isolation structure includes a first sub-line, a second sub-line and a third sub-line which are configured to be stacked with each other; the second sub-line is between the first sub-line and the third sub-line; and a width of the second sub-line is less than a width of the first sub-line and a width of the third sub-line.

20. A display apparatus, comprising:

a display panel, including a display region and a non-display region adjacent to the display region, comprising:

a substrate;

a drive circuit layer, at least including a first metal layer and a second metal layer, wherein the second metal layer is on a side of the first metal layer away from the substrate;

a light-emitting functional layer, on a side of the drive circuit layer away from the substrate, wherein the light-emitting functional layer includes a plurality of light-emitting portions; and a first electrode layer, on a side of the light-emitting functional layer away from the substrate, wherein:

a plurality of first isolation structures is on a side of the substrate and in the non-display region; and at least one first isolation structure isolates at least one of the light-emitting functional layer, the first electrode layer, and other corresponding film layers extending to the non-display region;

along a direction perpendicular to a plane of the display panel, the at least one first isolation structure includes a first portion and a second portion which are configured to be stacked with each other; the first portion is at the first metal layer; the second portion is at the second metal layer; and the first metal layer and the second metal layer are separated by an insulating layer; and an orthographic projection of the first portion on the plane of the display panel covers an orthographic projection of the second portion on the plane of the display panel such that the first portion, the second portion, and the insulating layer together form the first isolation structure with a tapered structure.

* * * * *